(12) United States Patent
Sasaki

(10) Patent No.: US 9,559,214 B2
(45) Date of Patent: Jan. 31, 2017

(54) SEMICONDUCTOR DEVICE

(71) Applicant: Japan Display Inc., Tokyo (JP)

(72) Inventor: Toshinari Sasaki, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/950,777

(22) Filed: Nov. 24, 2015

(65) Prior Publication Data
US 2016/0155851 A1 Jun. 2, 2016

(30) Foreign Application Priority Data

Dec. 2, 2014 (JP) ................. 2014-243840

(51) Int. Cl.
*H01L 29/786* (2006.01)
*H01L 29/417* (2006.01)
*H01L 29/423* (2006.01)
*H01L 29/66* (2006.01)
*H01L 27/12* (2006.01)

(52) U.S. Cl.
CPC ....... *H01L 29/7869* (2013.01); *H01L 27/1225* (2013.01); *H01L 29/41733* (2013.01); *H01L 29/42384* (2013.01); *H01L 29/66969* (2013.01); *H01L 29/78642* (2013.01); *H01L 29/78696* (2013.01)

(58) Field of Classification Search
CPC ............... H01L 2924/00; H01L 2924/0002; H01L 27/1225; H01L 29/7869; H01L 2924/00014
See application file for complete search history.

(56) References Cited

U.S. PATENT DOCUMENTS 8,759,833 B2 * 6/2014 Kim ................. H01L 29/78633 257/59

FOREIGN PATENT DOCUMENTS

JP  2010-062229 A  3/2010

* cited by examiner

*Primary Examiner* — Tony Tran
(74) *Attorney, Agent, or Firm* — TYPHA IP LLC

(57) ABSTRACT

A semiconductor device includes a first electrode, a first insulating layer having a first opening reaching the first electrode and having a ring-shaped first side wall exposed to the first opening, an oxide semiconductor layer on the first side wall, the oxide semiconductor layer being connected with the first electrode, a gate insulating layer on the oxide semiconductor layer, the oxide semiconductor layer being between the first side wall and the gate insulating layer, a gate electrode facing the oxide semiconductor layer on the first side wall, the gate insulating layer being between the oxide semiconductor layer and the gate electrode, and a second electrode above the first insulating layer, the second electrode being connected with the oxide semiconductor layer.

18 Claims, 24 Drawing Sheets

SEMICONDUCTOR DEVICE

CROSS REFERENCE TO RELATED APPLICATIONS

This application is based upon and claims the benefit of priority from the prior Japanese Patent Application No. 2014-243840 filed on Dec. 2, 2014, the entire contents of which are incorporated herein by reference.

FIELD

The present invention relates to a semiconductor device, and an embodiment disclosed herein relates to a structure and a layout of a semiconductor device.

BACKGROUND

Recently, a driving circuit of a display device, a personal computer or the like includes a semiconductor device such as a transistor, a diode or the like as a microscopic switching element. Especially in a display device, a semiconductor device is used as a selective transistor that supplies a voltage or a current in accordance with the gray scale of each of pixels and also used in a driving circuit that selects a pixel that supplies the voltage or the current. The characteristics required of a semiconductor vary in accordance with the use thereof. For example, a semiconductor used as a selective transistor is required to have a low off-current or little variance from another selective semiconductor. A semiconductor used in a driving circuit is required to have a high on-current.

To be used in a display device as described above, a semiconductor device including a channel formed of amorphous silicon, low-temperature polysilicon or single crystalline silicon has been conventionally developed. A semiconductor device including a channel formed of amorphous silicon can be formed with a simpler structure and in a low-temperature process of 400° C. or lower, and therefore can be formed, for example, by use of a large glass substrate referred to as an eighth-generation glass substrate (2160× 2460 mm). However, such a semiconductor device including a channel formed of amorphous silicon has a low mobility and is not usable in a driving circuit.

A semiconductor device including a channel formed of low-temperature polysilicon or single crystalline silicon has a higher mobility than the semiconductor device including a channel formed of amorphous silicon, and therefore is usable as a selective transistor and also in a driving circuit. However, such a semiconductor device including a channel formed of low-temperature polysilicon or single crystalline silicon has a complicated structure and needs a complicated process to be manufactured. In addition, such a semiconductor device needs to be formed in a high temperature process of 500° C. or higher, and therefore cannot be formed by use of a large glass substrate as described above. A semiconductor device including a channel formed of amorphous silicon, low-temperature polysilicon or single crystalline silicon has a high off-current. In the case where such a semiconductor device is used as a selective transistor, it is difficult to keep the applied voltage for a long time.

For the above-described reasons, a semiconductor device including a channel formed of an oxide semiconductor, instead of amorphous silicon, low-temperature polysilicon or single crystalline silicon, has been progressively developed recently (e.g., Japanese Laid-Open Patent Publication No. 2010-062229). It is known that a semiconductor device including a channel formed of an oxide semiconductor can be formed with a simple structure and in a low-temperature process like a semiconductor device including a channel formed of amorphous silicon, and has a mobility higher than that of a semiconductor device including a channel formed of amorphous silicon. It is also known that such a semiconductor device including a channel formed of an oxide semiconductor has a very low off-current.

However, the mobility of the semiconductor device including a channel formed of an oxide semiconductor is lower than that of the semiconductor device including a channel formed of low-temperature polysilicon or single crystalline silicon. Therefore, in order to provide a higher on-current, the semiconductor device including a channel formed of an oxide semiconductor needs to have a shorter channel length (L length). In order to shorten the channel length of the semiconductor device described in Japanese Laid-Open Patent Publication No. 2010-062229, a distance between a source and a drain needs to be shortened.

The distance between a source and a drain is determined by a photolithography step and an etching step. In the case where patterning is performed by photolithography, size reduction is restricted by the size of a mask pattern of an exposure device. Especially in the case where patterning is performed on a glass substrate by photolithography, the minimum size of a mask pattern is about 2 μm, and the reduction in the channel length of the semiconductor device is restricted by such a size of the mask pattern. The channel length of the semiconductor device is restricted by photolithography, and therefore, is influenced by the in-plane variance of the substrate in the photolithography step.

SUMMARY

A semiconductor device in an embodiment according to the present invention includes a first electrode, a first insulating layer having a first opening reaching the first electrode and having a ring-shaped first side wall exposed to the first opening, an oxide semiconductor layer on the first side wall, the oxide semiconductor layer being connected with the first electrode, a gate insulating layer on the oxide semiconductor layer, the oxide semiconductor layer being between the first side wall and the gate insulating layer, a gate electrode facing the oxide semiconductor layer on the first side wall, the gate insulating layer being between the oxide semiconductor layer and the gate electrode, and a second electrode above the first insulating layer, the second electrode being connected with the oxide semiconductor layer.

A semiconductor device in another embodiment according to the present invention includes a first insulating layer having a ring-shaped first side wall, an oxide semiconductor layer on the first side wall, a gate insulating layer on the oxide semiconductor layer, the oxide semiconductor layer being between the first side wall and the gate insulating layer, a gate electrode facing the oxide semiconductor layer on the first side wall, the gate insulating layer being between the oxide semiconductor layer and the gate electrode, a first electrode below the first insulating layer, the first electrode being connected with a first portion of the oxide semiconductor layer, and a second electrode above the first insulating layer, the second electrode being connected with a second portion of the oxide semiconductor layer.

DESCRIPTION OF EMBODIMENTS

Figure 1:
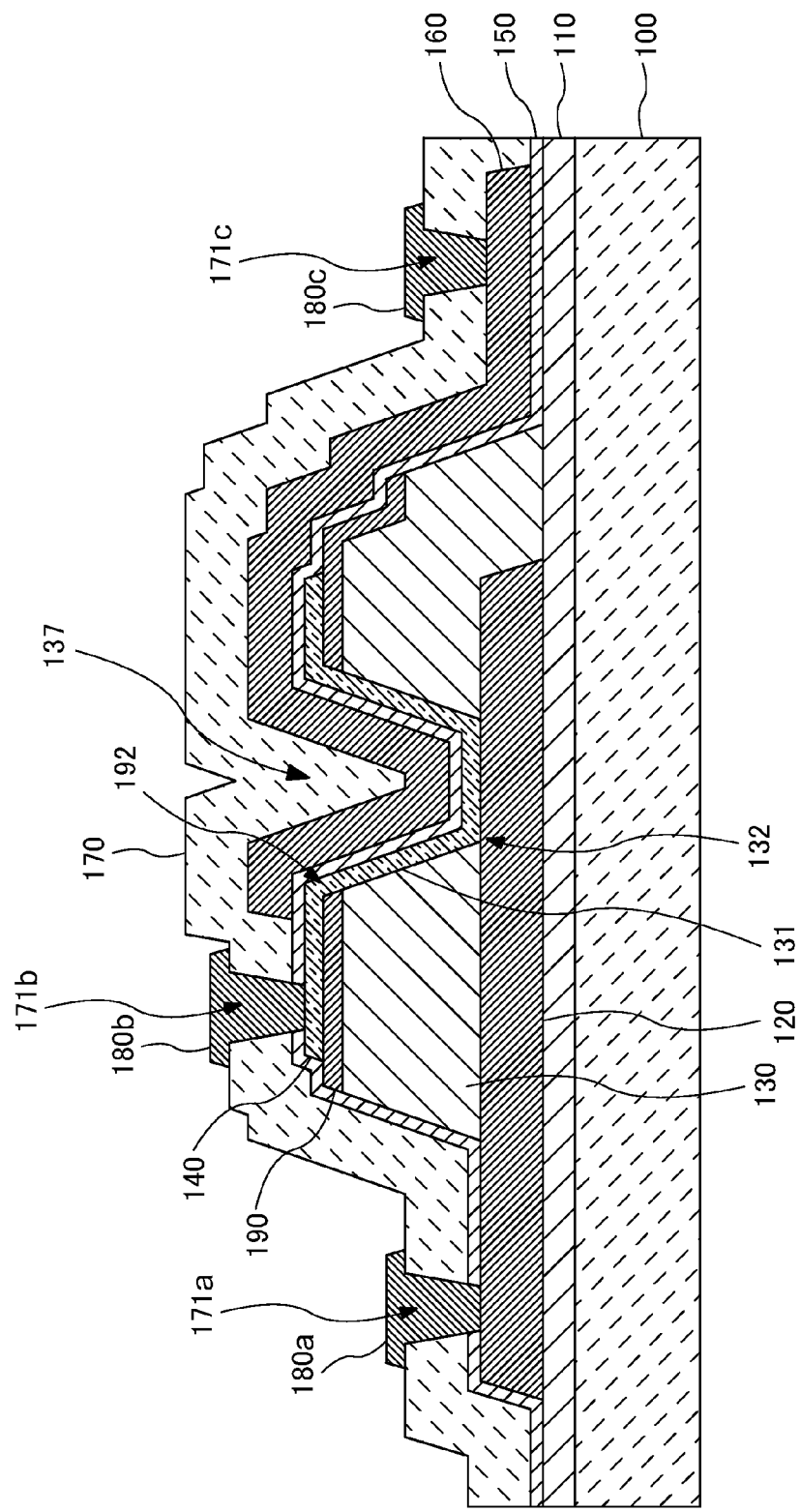
FIG. 1 is a cross-sectional view showing an overview of a semiconductor device in an embodiment according to the present invention.

Hereinafter, embodiments of the present invention will be described with reference to the drawings. The disclosure is merely exemplary, and alternations and modifications easily conceivable by a person of ordinary skill in the art without departing from the gist of the present invention are duly encompassed in the scope of the present invention. In the drawings, components may be shown schematically regarding the width, thickness, shape and the like, instead of being shown in accordance with the actual sizes, for the sake of clear illustration. The drawings are merely exemplary and do not limit the interpretations of the present invention in any way. In the specification and the drawings, components that are substantially the same as those shown in a previous drawing(s) bear the identical reference signs thereto, and detailed descriptions thereof may be omitted. The following embodiments are presented for the purpose of providing a semiconductor device capable of increasing the on-current or providing a semiconductor device capable of suppressing the in-plane variance of the channel length.

Embodiment 1

With reference to FIG. 1, an overview of a semiconductor device 10 in embodiment 1 according to the present invention will be described. The semiconductor device 10 in embodiment 1 is usable in a pixel or a driving circuit of a liquid crystal display device (LCD), a spontaneous light-emitting device using an organic light-emitting diode (OLED) such as an organic EL element, a quantum dot or the like for a display unit, or a reflection-type display device such as an electronic paper or the like.

It should be noted that a semiconductor device according to the present invention is not limited to being used in a display device, and may be used in, for example, an integrated circuit (IC) such as a microprocessing unit (MPU) or the like. The semiconductor device 10 in embodiment 1 is described as having a structure including a channel formed of an oxide semiconductor. The semiconductor device 10 in embodiment 1 is not limited to having such a structure, and may include a channel formed of, for example, a semiconductor such as silicon or the like, a compound semiconductor such as Ga—As or the like, or an organic semiconductor such as pentacene, tetracyanoquinodimethane (TCNQ) or the like. In embodiment 1, the semiconductor device 10 is a transistor. This does not limit the semiconductor device according to the present invention to a transistor.

[Structure of the Semiconductor Device 10]

FIG. 1 is a cross-sectional view showing an overview of the semiconductor device 10 in embodiment 1 according to the present invention. As shown in FIG. 1, the semiconductor device 10 includes a substrate 100, an underlying layer 110 located on the substrate 100, a lower electrode 120 located on the underlying layer 110, a first insulating layer 130 located on the lower electrode 120, having a first opening 137 reaching the lower electrode 120 and having a ring-shaped first side wall 131 exposed to the first opening 137, a first assisting electrode 190 located above the first insulating layer 130, and an oxide semiconductor layer 140 located on the first assisting electrode 190 and the first side wall 131 and connected with the lower electrode 120 located below the oxide semiconductor layer 140. The first assisting electrode 190 may be described as being located, at a position above the first insulating layer 130, between the first insulating layer 130 and the oxide semiconductor layer 140. Herein, an expression that "a first member and a second member are connected with each other" indicates that the first member and the second member are at least electrically connected with each other. Namely, the first member and the second member may be physically connected with each other directly, or another member may be provided between the first member and the second member.

The semiconductor device 10 also includes a gate insulating layer 150 located opposite to the first side wall 131 while having the oxide semiconductor layer 140 therebetween, and a gate electrode 160 facing the oxide semiconductor layer 140 located at least on the first side wall 131, with the gate insulating layer 150 being located between the oxide semiconductor layer 140 and the gate electrode 160. The semiconductor device 10 further includes an interlayer insulating layer 170 (second insulating layer) located on the gate electrode 160, and upper electrodes 180 located in openings 171 formed in the second insulating layer 170. The upper electrodes 180 specifically include upper electrodes 180a, 180b and 180c, but may be collectively referred to as the "upper electrodes 180" in the case where the upper electrodes 180a, 180b and 180c are not specifically distinguished from each other. The upper electrodes 180a, 180b and 180c are respectively connected with the lower electrode 120, the oxide semiconductor layer 140 and the gate electrode 160. The openings 171 specifically include a second opening 171, a third opening 171b and a fourth opening 171c, but may be collectively referred to as the "openings 171" in the case where the second, third and fourth openings 171a, 171b and 171c are not specifically distinguished from each other. A part of the upper electrodes 180 (upper electrode 180b) is located above the first insulating layer 130.

The oxide semiconductor layer 140 includes a portion (first portion) thereof connected with the lower electrode 120 in a region 132 and another portion (second portion) thereof connected with the upper electrode 180b and the first assisting electrode 190 in a region 192. In the case where a source voltage is applied to the upper electrode 180a and a drain voltage is applied to the upper electrode 180b, the region 132 may be referred to as a "source region" and the region 192 may be referred to as a "drain region". The upper electrode 180b is connected with the oxide semiconductor layer 140 on a side opposite to the first assisting electrode 190.

The first side wall 131 may have a tapered inclining surface tending to close upward. Such a shape may be referred to as "forward tapered". In this case, the oxide semiconductor layer 140 may be described as being located on the first side wall 131. The gate insulating layer 150 may be described as being located on the oxide semiconductor layer 140. The gate electrode 160 may be described as being located on the gate insulating layer 150. In FIG. 1, the first assisting electrode 190 is located to cover a top surface of the first insulating layer 130. The first assisting electrode 190 does not need to be formed on the entirety of the top surface of the first insulating layer 130. It is sufficient that the first assisting electrode 190 is formed on at least a part of the top surface of the first insulating layer 130. The first assisting electrode 190 may be formed on a part of the first side wall 131 in addition to on the top surface of the first insulating layer 130.

The substrate 100 may be formed of glass. Alternatively, the substrate 100 may be formed of a light-transmissive insulating material such as quartz, sapphire, a resin or the like. In the case where the semiconductor device 10 is used in an integrated circuit, not in a display device, the substrate 100 may be formed of a light-non-transmissive material, for example, a semiconductor such as silicon, silicon carbide, a compound semiconductor or the like, or a conductive material such as stainless steel or the like.

The underlying layer 110 may be formed of a material that suppresses diffusion of impurities from the substrate 100 into the oxide semiconductor layer 140. For example, the underlying layer 110 may be formed of silicon nitride ($SiN_x$), silicon nitride oxide ($SiN_xO_y$), silicon oxide ($SiO_x$), silicon oxide nitride ($SiO_xN_y$), aluminum nitride ($AlN_x$), aluminum nitride oxide ($AlN_xO_y$), aluminum oxide ($AlO_x$), aluminum oxide nitride ($AlO_xN_y$), or the like (x and y each represent an arbitrary value). Alternatively, the underlying layer 110 may have a structure including a stack of films of such materials.

$SiO_xN_y$ and $AlO_xN_y$ are respectively a silicon compound and an aluminum compound containing nitrogen (N) at a lower content than oxygen (O). $SiN_xO_y$ and $AlN_xO_y$ are respectively a silicon compound and an aluminum compound containing oxygen at a lower content than nitrogen.

The underlying layer 110 described above as an example is formed of a thin film, the thickness of which is controllable by a nanometer order (range less than 1 μm). The underlying layer 110 may be formed by a PVD (Physical Vapor Deposition) method or a CVD (Chemical Vapor Deposition) method. Examples of the usable PVD method include sputtering, vacuum vapor deposition, electron beam vapor deposition, plating, molecular beam epitaxy, and the like. Examples of the usable CVD method include thermal CVD, plasma CVD, catalyst CVD (catalytic-CVD or hot-wire CVD), and the like. A method other than the above-listed vapor deposition methods may be used as long as the film thickness can be controlled by a nanometer order.

The lower electrode 120 may be formed of a common metal material or a common conductive semiconductor material. For example, the lower electrode 120 may be formed of aluminum (Al), titanium (Ti), chromium (Cr), cobalt (Co), nickel (Ni), zinc (Zn), molybdenum (Mo), indium (In), tin (Sn), hafnium (Hf), tantalum (Ta), tungsten (W), platinum (Pt), bismuth (Bi), or the like. Alternatively, the lower electrode 120 may be formed of an alloy of such materials or a nitride of such materials. Still alternatively, the lower electrode 120 may be formed of a conductive oxide semiconductor such as ITO (indium tin oxide), IGO (indium gallium oxide), IZO (indium zinc oxide), GZO (zinc oxide containing gallium as a dopant), or the like. The lower electrode 120 may have a structure including a stack of films of such materials.

Preferably, the material used for the lower electrode 120 is resistant to a heat treatment in a manufacturing process of a semiconductor device including a channel formed of an oxide semiconductor, and has a low contact resistance with the oxide semiconductor layer 140. As a material having a good electric contact with the oxide semiconductor layer 140, a metal material having a work function smaller than that of the oxide semiconductor layer 140 is usable.

The first insulating layer 130 may be formed of an inorganic insulating material such as $SiO_x$, $SiN_x$, $SiO_xN_y$, $SiN_xO_y$, $AlO_x$, $AlN_x$, $AlO_xN_y$, $AlN_xO_y$, or the like, like the underlying layer 110. Alternatively, the first insulating layer 130 may be formed of an organic insulating material such as a polyimide resin, an acrylic resin, an epoxy resin, a silicone resin, a fluorine resin, a siloxane resin, or the like. The first insulating layer 130 is formed of a thin film, the thickness of which is controllable by a nanometer order. The first insulating layer 130 may be formed by substantially the same method as that of the underlying layer 110. The first insulating layer 130 and the underlying layer 110 may be formed of the same material as, or different materials from, each other.

In the example shown in FIG. 1, the first insulating layer 130 has a cross-section with the forward tapered first side wall 131 being linear. The first insulating layer 130 is not limited to having this structure. The forward tapered first side wall 131 may be curved as protruding outward or curved as protruding inward. Instead of being forward tapered, the first side wall 131 may be vertical with respect to the surface of the substrate 100, or reverse tapered, namely, incline while tending to close downward.

In the example shown in FIG. 1, the first insulating layer 130 is formed of a single layer. The first insulating layer 130 is not limited to having this structure, and may include a stack of a plurality of layers. In the case where the first insulating layer 130 includes a stack structure, the tapering angle and the shape of the first side wall 131 may be different layer by layer. Alternatively, the first insulating layer 130 may include a stack of layers of different properties (e.g., $SiN_x$ and $SiO_x$) such that different portions, along the first side wall 131, of the oxide semiconductor layer 140 have different properties. Namely, the semiconductor device 10 may have a channel formed of portions of the oxide semiconductor layer 140 that are of different characteristics and are connected to each other in series.

The oxide semiconductor layer 140 may be formed of a metal oxide material having the characteristics of a semiconductor. For example, the oxide semiconductor layer 140 may be formed of an oxide semiconductor containing indium (In), gallium (Ga), Zinc (Zn) and oxygen (O). Especially, the oxide semiconductor layer 140 may be formed of an oxide semiconductor having a composition ratio of In:Ga:Zn:O=1:1:1:4. It should be noted that the oxide semiconductor used in the present invention and containing In, Ga, Zn and O is not limited to having the above-described composition ratio. An oxide semiconductor having a different composition ratio is also usable. For example, in order to improve the mobility, the ratio of In may be increased. In order to increase the bandgap and thus decrease the influence of light, the ratio of Ga may be increased.

The oxide semiconductor containing In, Ga, Zn and O may contain another element added thereto. For example, a metal element such as Al, Sn or the like may be added. Instead of the above-described oxide semiconductor, zinc oxide (ZnO), nickel oxide (NiO), tin oxide ($SnO_2$), titanium oxide ($TiO_2$), vanadium oxide ($VO_2$), indium oxide ($In_2O_3$), strontium titanate ($SrTiO_3$), or the like may be used. The oxide semiconductor layer 140 may be amorphous or crystalline. Alternatively, the oxide semiconductor layer 140 may have a mixed phase of an amorphous phase and a crystalline phase.

The gate insulating layer 150 may be formed of an inorganic insulating material such as $SiO_x$, $SiN_x$, $SiO_xN_y$, $SiN_xO_y$, $AlO_x$, $AlN_x$, $AlO_xN_y$, $AlN_xO_y$, or the like, like the underlying layer 110 and the first insulating layer 130. Alternatively, the gate insulating layer 150 may have a structure including a stack of insulating films of such materials. The gate insulating layer 150 may be formed by substantially the same method as that of the underlying layer 110. The gate insulating layer 150, the underlying layer 110 and the first insulating layer 130 may be formed of the same material as, or different materials from, each other.

The gate electrode 160 may be formed of any of substantially the same materials as those described above regarding the lower electrode 120. The gate electrode 160 may be formed of the same material as, or a different material from, that of the lower electrode 120. Preferably, the material used for the gate electrode 160 is resistant to a heat treatment in a manufacturing process of a semiconductor device including a channel formed of an oxide semiconductor, and has a work function with which the transistor is of an enhancement type that is turned off when the gate electrode is of 0 V.

The second insulating layer 170 may be formed of an inorganic insulating material such as $SiO_x$, $SiN_x$, $SiO_xN_y$, $SiN_xO_y$, $AlO_x$, $AlN_x$, $AlO_xN_y$, $AlN_xO_y$, or the like, like the underlying layer 110, the first insulating layer 130 and the gate insulating layer 150. The second insulating layer 170 may be formed by substantially the same method as that of the underlying layer 110. Instead of the above-listed inorganic insulating materials, the second insulating layer 170 may be formed of a TEOS layer or an organic insulating material. The TEOS layer refers to a CVD layer formed of TEOS (Tetra Ethyl Ortho Silicate), and has an effect of alleviating the steps of, and thus flattening, a layer therebelow. The underlying layer 110, the first insulating layer 130 and the gate insulating layer 150 may be formed of a TEOS layer. Examples of the usable organic insulating material include a polyimide resin, an acrylic resin, an epoxy resin, a silicone resin, a fluorine resin, a siloxane resin, and the like. The second insulating layer 170 may be formed of a single layer or a stack of films of such materials. For example, the second insulating layer 170 may include a stack of an inorganic insulating material and an organic insulating material.

The upper electrodes 180 and the first assisting electrode 190 may be formed of any of substantially the same materials as those described above regarding of the lower electrode 120 and the gate electrode 160. The upper electrodes 180 and the first assisting electrode 190 may be formed of the same material as, or a different material from, that of the lower electrode 120 and the gate electrode 160. The upper electrodes 180 and the first assisting electrode 190 may be formed of the same material as, or different materials from, each other. Alternatively, the upper electrodes 180 and the first assisting electrode 190 may be formed of copper (Cu), silver (Ag), gold (Au), or the like instead of the above-listed materials regarding the lower electrode 120 and the gate electrode 160. Especially in the case where Cu is used for forming the upper electrodes 180, a Cu layer and a barrier layer formed of Ti, TiN or the like that suppresses diffusion of Cu, which would otherwise be caused by heat, may be stacked together.

Preferably, the material used for each of the upper electrodes 180 and the first assisting electrode 190 is resistant to a heat treatment in a manufacturing process of a semiconductor device including a channel formed of an oxide semiconductor, and has a low contact resistance with the oxide semiconductor layer 140. As a material having a good electric contact with the oxide semiconductor layer 140, a metal material having a work function smaller than that of the oxide semiconductor layer 140 is usable for the upper electrodes 180 and the first assisting electrode 190. The upper electrodes 180 and the first assisting electrode 190 may be formed of the same material as, or different materials from, each other. The portion of the oxide semiconductor layer 140 that is located between the upper electrode 180b and the first assisting electrode 190 may have a conductivity higher than that of the other portion of the oxide semiconductor layer 140.

[Operation of the Semiconductor Device 10]

An operation of the semiconductor device 10 shown in FIG. 1 will be described. The semiconductor device 10 is a transistor including a channel formed of the oxide semiconductor layer 140. A gate voltage is applied to the upper electrode 180c connected with the gate electrode 160, a drain voltage is applied to the upper electrode 180a connected with the lower electrode 120, and a source voltage is applied to the upper electrode 180b connected with the oxide semiconductor layer 140. The source voltage and the drain voltage may be applied oppositely. The source voltage applied to the upper electrode 180b is supplied to the first assisting electrode 190 via the oxide semiconductor layer 140.

When the gate voltage is applied to the gate electrode 160, an electric field in accordance with the gate voltage is formed, via the gate insulating layer 150, in the portion of the oxide semiconductor layer 140 facing the gate electrode 160. The electric field generates carriers in the oxide semiconductor layer 140. When a potential difference is caused between the lower electrode 120 and the first assisting electrode 190 in the state where the carriers are generated in the oxide semiconductor layer 140, the carriers generated in the oxide semiconductor layer 140 are moved in accordance with the potential difference. Namely, electrons are moved from the first assisting electrode 190 to the lower electrode 120.

The lower electrode 120 and the first assisting electrode 190 have a conductivity higher than that of the oxide semiconductor layer 140 in which the carriers are generated. Therefore, the electrons are supplied to the oxide semiconductor layer 140 in the source region 192 and are transferred to the lower electrode 120 in the drain region 132. Namely, in the semiconductor device 10, the portion of the oxide semiconductor layer 140 that is located on the first side wall 131 of the first insulating layer 130 acts as a channel. The channel length of the semiconductor device 10 is determined by the thickness of the first insulating layer 130 and the tapering angle of the first side wall 131.

As described above, in the semiconductor device 10 in embodiment 1 according to the present invention, the portion of the oxide semiconductor layer 140 that is located on the first side wall 131 of the first insulating layer 130 acts as a channel. Therefore, the channel length of the semiconductor device 10 may be controlled by controlling either the thickness of the first insulating layer 130 or the tapering angle of the first side wall 131, or by controlling both of the thickness of the first insulating layer 130 and the tapering angle of the first side wall 131. As described above, the thickness of the first insulating layer 130 formed by a PVD method or a CVD method may be controlled by a nanometer order. Therefore, the semiconductor device 10 may have a channel length shorter than the limit of patterning by photolithography, by which variance is of a micrometer order. As a result, the semiconductor device 10 is capable of increasing the on-current.

The thickness of the first insulating layer 130 may be controlled by a nanometer order. Therefore, the in-plane variance of the thickness may also be controlled by a nanometer order. The tapering angle of the first side wall 131 may be controlled by the etching rate and the retraction amount of the resist for the first insulating layer 130. The variance of the etching rate and the retraction amount of the resist for the first insulating layer 130 may also be controlled by substantially the same order as the variance of the thickness of the first insulating layer 130. Therefore, the in-plane variance of the thickness of the first insulating layer 130 and the tapering angle of the first side wall 131 is smaller than the in-plane variance of the patterning precision by photolithography, which is of a micrometer order. As a result, the semiconductor device 10 is capable of suppressing the in-plane variance of the channel length. A top portion of the channel region formed of the oxide semiconductor layer 140 is covered with the gate electrode 160, and a bottom portion thereof is covered with the lower electrode 120. Therefore, in the case where the gate electrode 160 and the lower electrode 120 are formed of a light-non-transmissive metal material, the oxide semiconductor layer 140 is prevented from being irradiated with external light. As a result, the semiconductor device 10 has the characteristics thereof change little even in an environment where the semiconductor device 10 is irradiated with light.

[Manufacturing Method of the Semiconductor Device 10]

Figure 2A:
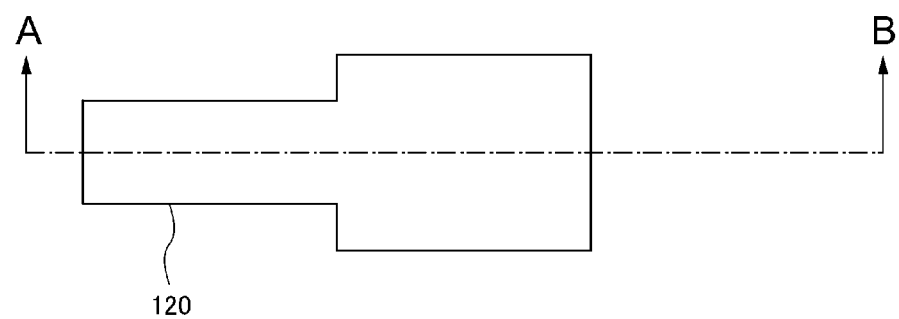
FIG. 2A is a plan view showing a step of forming a lower electrode in a manufacturing method of the semiconductor device in the embodiment according to the present invention.
Figure 2B:
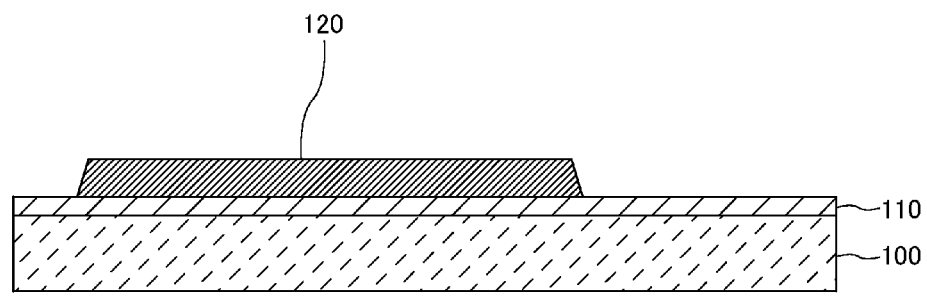
FIG. 2B is a cross-sectional view showing the step of forming the lower electrode in the manufacturing method of the semiconductor device in the embodiment according to the present invention.

With reference to plan views and cross-sectional views provided in FIG. 2 through FIG. 7, a manufacturing method of the semiconductor device 10 in embodiment 1 according to the present invention will be described. FIG. 2A and FIG. 2B (FIG. 2) are respectively a plan view and a cross-sectional view showing a step of forming the lower electrode 120 in the manufacturing method of the semiconductor device 10 in embodiment 1 according to the present invention. Referring to FIG. 2B, the underlying layer 110 and a film for the lower electrode 120 are formed on the substrate 100, and patterning is performed as shown in FIG. 2A by photolithography and etching to form the lower electrode 120. Preferably, the etching is performed to form the lower electrode 120 under the condition that the etching rate ratio of the lower electrode 120 with respect to the underlying layer 110 is high. In this and the following descriptions of manufacturing methods of semiconductor devices in embodiments according to the present invention, an assembly of the substrate 100 and the film(s) formed thereon at each step will be referred to as the "substrate" for the sake of convenience.

Figure 3A:
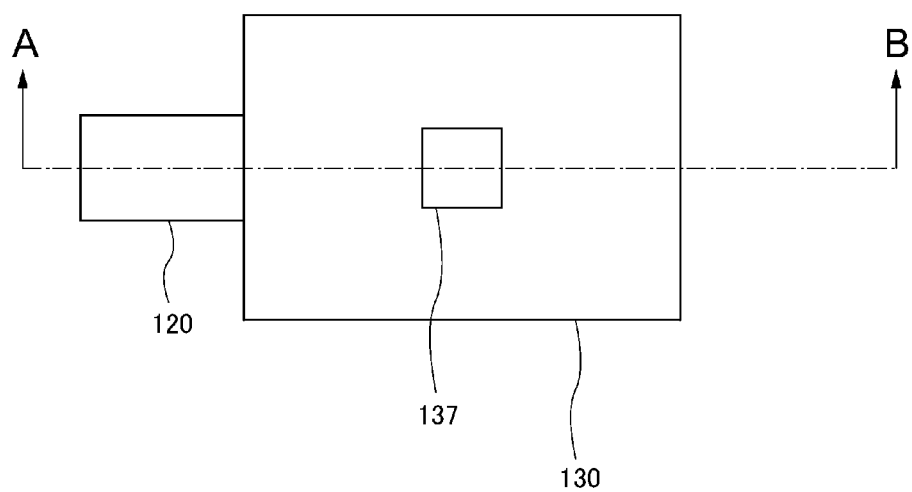
FIG. 3A is a plan view showing a step of forming a first insulating layer and a first assisting electrode in the manufacturing method of the semiconductor device in the embodiment according to the present invention.
Figure 3B:
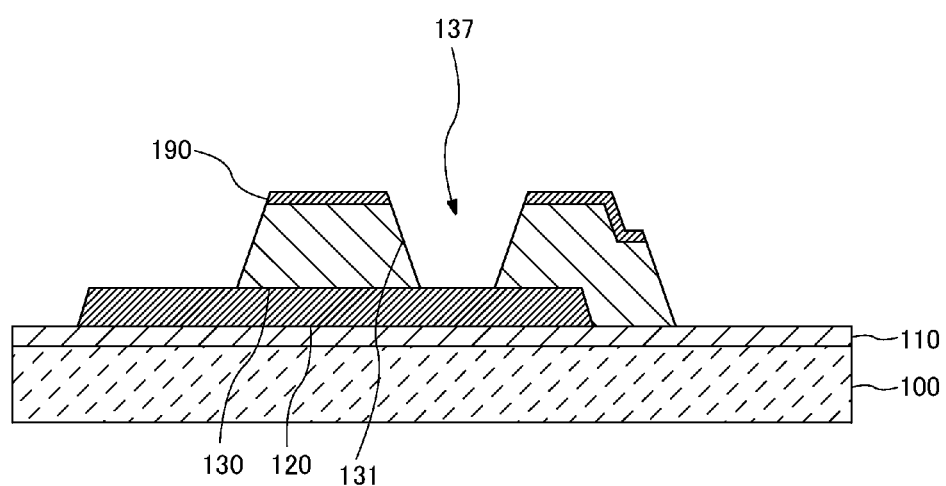
FIG. 3B is a cross-sectional view showing the step of forming the first insulating layer and the first assisting electrode in the manufacturing method of the semiconductor device in the embodiment according to the present invention.

FIG. 3A and FIG. 3B (FIG. 3) are respectively a plan view and a cross-sectional view showing a step of forming the first insulating layer 130 and the first assisting electrode 190 in the manufacturing method of the semiconductor device 10 in embodiment 1 according to the present invention. Referring to FIG. 3B, a film for the first insulating layer 130 and a film for the first assisting electrode 190 are formed on the entirety of the substrate shown in FIG. 2B, and patterning is performed as shown in FIG. 3A by photolithography and etching to form the first insulating layer 130 having the first opening 137 and the first assisting electrode 190. More specifically, the first side wall 131 of the first insulating layer 130 is formed to be ring-shaped. The first insulating layer 130 and the first assisting electrode 190 may be etched together or in separate steps. For example, after the first insulating layer 130 is formed by patterning, the film for the first assisting electrode 190 may be formed on the top surface and a side surface of the first insulating layer 130 and patterned to form the first assisting electrode 190 by photolithography and etching.

Preferably, the etching is performed to form the first insulating layer 130 under the condition that the etching rate ratio of the first insulating layer 130 with respect to at least the lower electrode 120 is high. More preferably, the etching is performed to form the first insulating layer 130 under the condition that the etching rate ratio of the first insulating layer 130 with respect to both of the lower electrode 120 and the underlying layer 110 is high. In the case where it is difficult to guarantee a high etching rate ratio of the first insulating layer 130 with respect to the underlying layer 110, for example, in the case where the first insulating layer 130 and the underlying layer 110 are formed of the same material, an etching stopper layer may be formed on the underlying layer 110. In the example shown in FIG. 3A, the pattern of the first opening 137 and the first side wall 131 is square. The first opening 137 is not limited to being square, and may be of any of various shapes, for example, circular, elliptical, polygonal, curved or the like.

Now, an etching method for forming the first side wall 131 of the first insulating layer 130 to be tapered will be described. The tapering angle of the first side wall 131 may be controlled by the etching rate of the first insulating layer 130 and the etching rate, in a horizontal direction, of a resist used as a mask for etching the first insulating layer 130 (hereinafter, referred to as the "retraction amount of the resist"). In the case where, for example, the retraction amount of the resist is smaller than the etching rate of the first insulating layer 130, the tapering angle of the first side wall 131 is large (close to vertical). In the case where the retraction amount of the resist is zero, the first side wall 131 is vertical. By contrast, in the case where the retraction amount of the resist is larger than the etching rate of the first insulating layer 130, the tapering angle of the first side wall 131 is small (close to horizontal). The retraction amount of the resist may be adjusted by the tapering angle of an end of the resist and the etching rate of the resist.

Figure 4A:
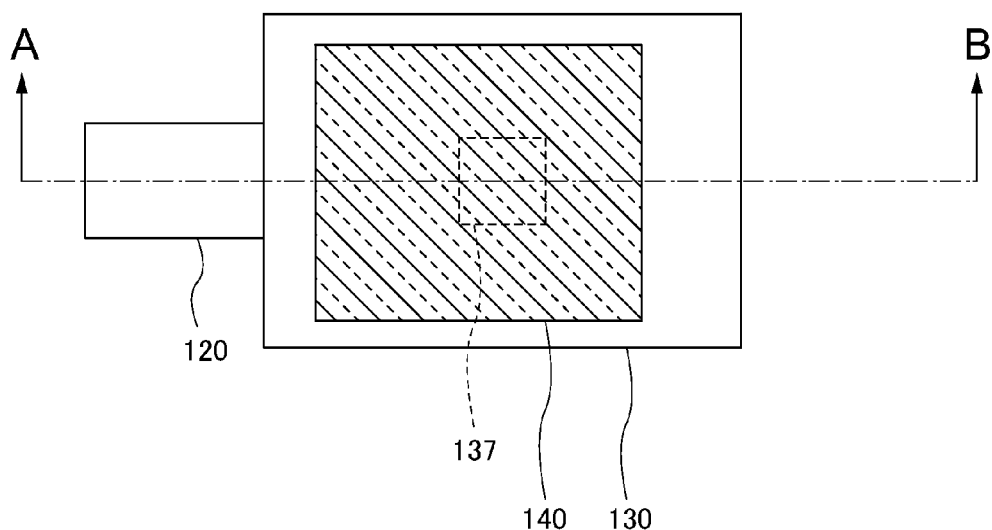
FIG. 4A is a plan view showing a step of forming an oxide semiconductor layer in the manufacturing method of the semiconductor device in the embodiment according to the present invention.
Figure 4B:
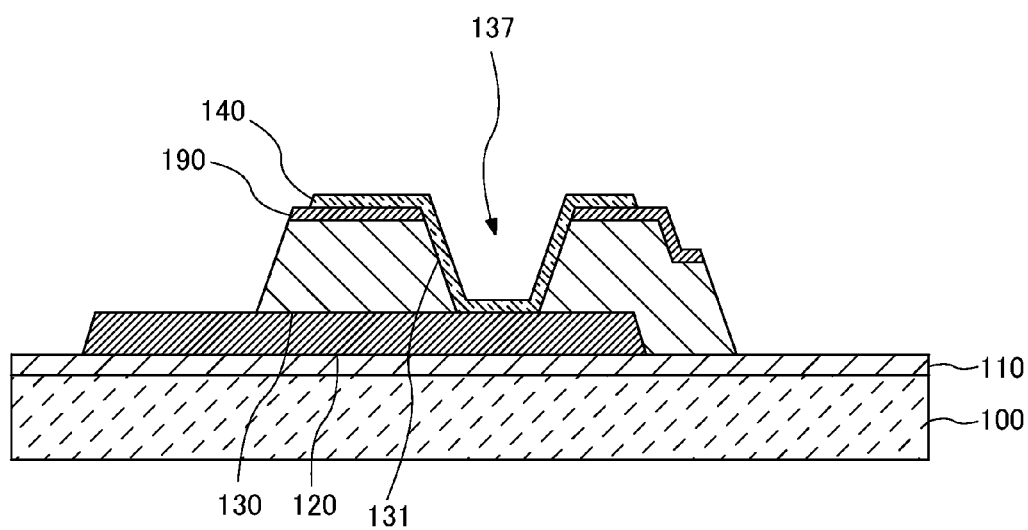
FIG. 4B is a cross-sectional view showing the step of forming the oxide semiconductor layer in the manufacturing method of the semiconductor device in the embodiment according to the present invention.

FIG. 4A and FIG. 4B (FIG. 4) are respectively a plan view and a cross-sectional view showing a step of forming the oxide semiconductor layer 140 in the manufacturing method of the semiconductor device 10 in embodiment 1 according to the present invention. Referring to FIG. 4B, a film for the oxide semiconductor layer 140 is formed on the entirety of the substrate shown in FIG. 3B, and patterning is performed as shown in FIG. 4A by photolithography and etching to form the oxide semiconductor layer 140. More specifically, the oxide semiconductor layer 140 is located to cover the ring-shaped first side wall 131. In other words, the oxide semiconductor layer 140 is located to overlap the first side wall 131 as seen in a plan view. The oxide semiconductor layer 140 may be formed by sputtering. The etching performed to form the oxide semiconductor layer 140 may be dry etching or wet etching. In the case where the oxide semiconductor layer 140 is formed by wet etching, an etchant containing oxalic acid may be used.

Figure 5A:
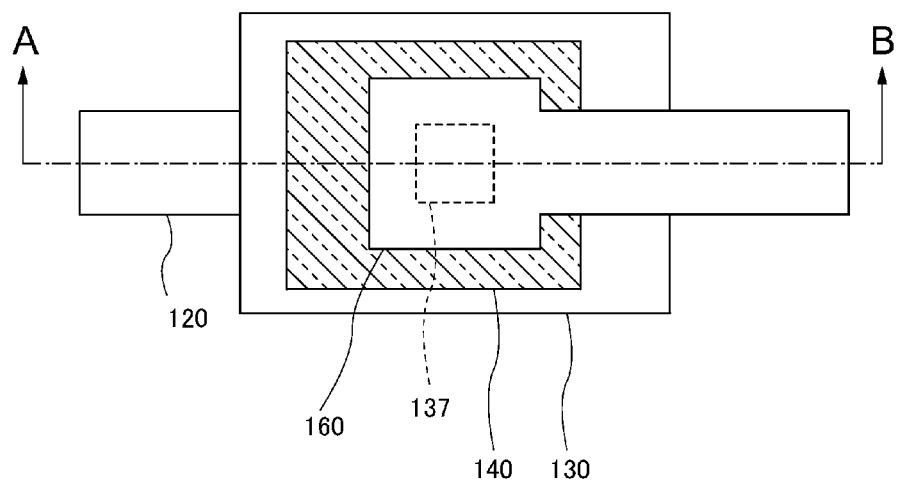
FIG. 5A is a plan view showing a step of forming a gate insulating layer and a gate electrode in the manufacturing method of the semiconductor device in the embodiment according to the present invention.
Figure 5B:
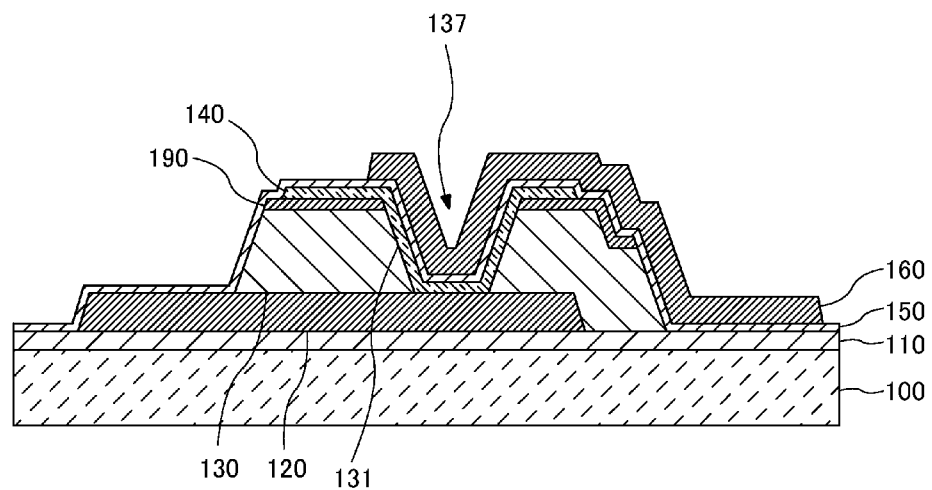
FIG. 5B is a cross-sectional view showing the step of forming the gate insulating layer and the gate electrode in the manufacturing method of the semiconductor device in the embodiment according to the present invention.

FIG. 5A and FIG. 5B (FIG. 5) are respectively a plan view and a cross-sectional view showing a step of forming the gate insulating layer 150 and the gate electrode 160 in the manufacturing method of the semiconductor device 10 in embodiment 1 according to the present invention. Referring to FIG. 5B, the gate insulating layer 150 and a film for the gate electrode 160 are formed on the entirety of the substrate shown in FIG. 4B, and patterning is performed as shown in FIG. 5A by photolithography and etching to form the gate electrode 160. In the example shown in FIG. 5B, the gate insulating layer 150 acts as an etching stopper for the gate electrode 160, and only the film for the gate electrode 160 is etched. Alternatively, both of the gate insulating layer 150 and the gate electrode 160 may be formed together by etching.

As shown in FIG. 5A, the gate electrode 160 is located to cover the oxide semiconductor layer 140, which is located on the first side wall 131 with the gate insulating layer 150 being provided therebetween. In other words, the gate electrode 160 is located to overlap the first side wall 131 as seen in a plan view.

Figure 6A:
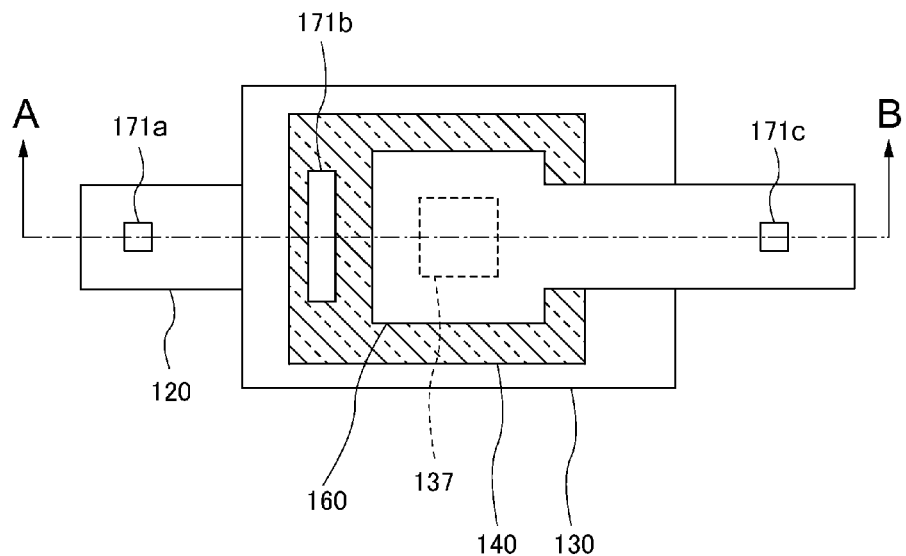
FIG. 6A is a plan view showing a step of forming a second insulating layer and also forming openings in the second insulating layer and the gate insulating layer in the manufacturing method of the semiconductor device in the embodiment according to the present invention.
Figure 6B:
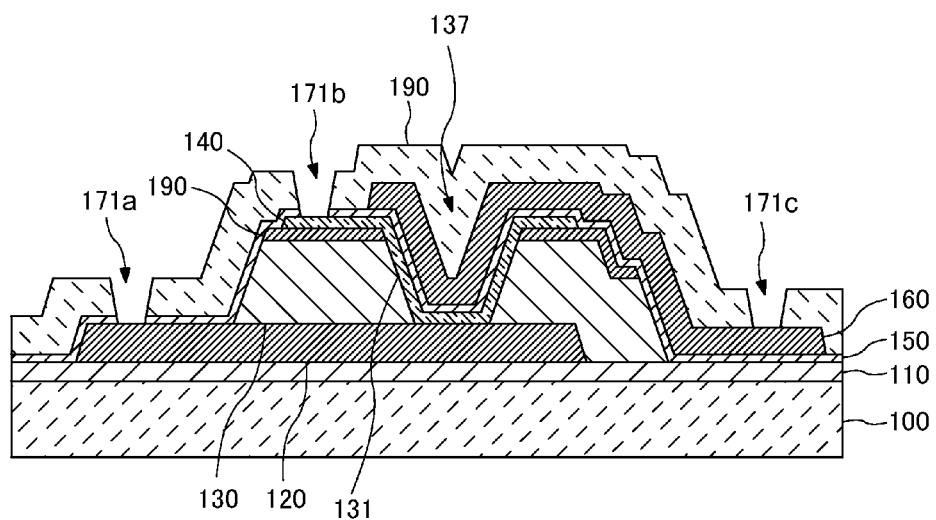
FIG. 6B is a cross-sectional view showing the step of forming the second insulating layer and also forming the openings in the second insulating layer and the gate insulating layer in the manufacturing method of the semiconductor device in the embodiment according to the present invention.

FIG. 6A and FIG. 6B (FIG. 6) are respectively a plan view and a cross-sectional view showing a step of forming the second insulating layer 170 and also forming the openings 171 in the second insulating layer 170 and the gate insulating layer 150 in the manufacturing method of the semiconductor device 10 in embodiment 1 according to the present invention. Referring to FIG. 6B, the second insulating layer 170 is formed on the entirety of the substrate shown in FIG. 5B, and patterning is performed as shown in FIG. 6A by photolithography and etching to form the openings 171. The second opening 171a exposes the lower electrode 120, the third opening 171b exposes the oxide semiconductor layer 140, and the fourth opening 171c exposes the gate electrode 160. Preferably, the etching rate ratio of the gate insulating layer 150 and the second insulating layer 170 with respect to the lower electrode 120, the oxide semiconductor layer 140 and the gate electrode 160 is high.

Figure 7A:
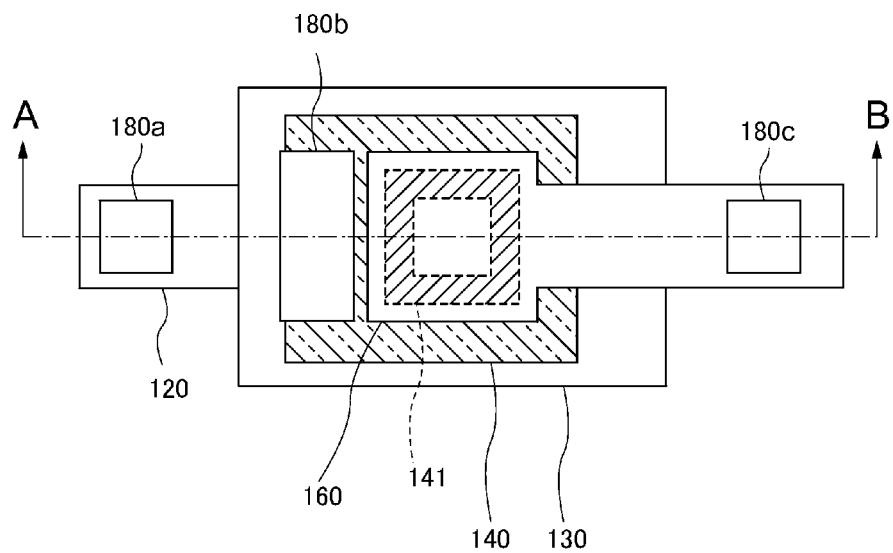
FIG. 7A is a plan view showing a step of forming upper electrodes in the manufacturing method of the semiconductor device in the embodiment according to the present invention.
Figure 7B:
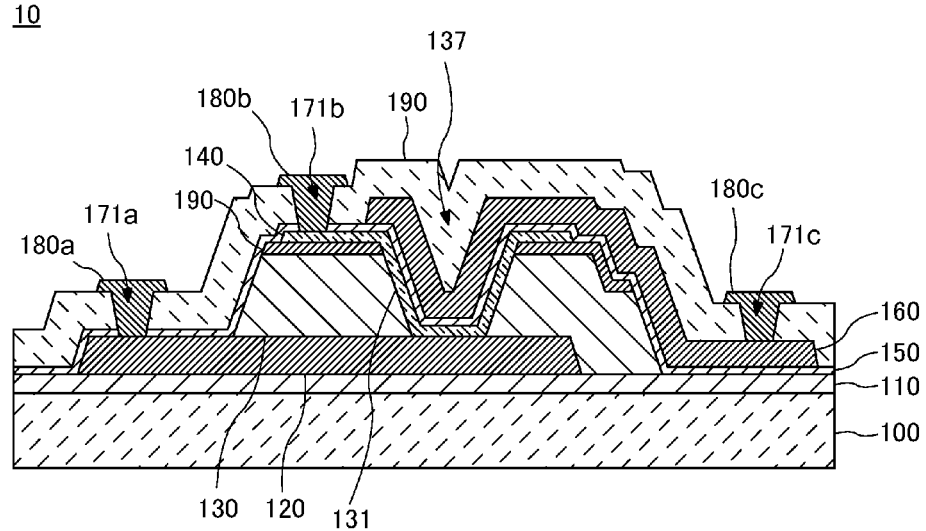
FIG. 7B is a cross-sectional view showing the step of forming the upper electrodes in the manufacturing method of the semiconductor device in the embodiment according to the present invention.

FIG. 7A and FIG. 7B (FIG. 7) are respectively a plan view and a cross-sectional view showing a step of forming the upper electrodes 180 in the manufacturing method of the semiconductor device 10 in embodiment 1 according to the present invention. Referring to FIG. 7B, a film for the upper electrodes 180 is formed on the entirety of the substrate shown in FIG. 6B, and patterning is performed as shown in FIG. 7A by photolithography and etching to form the upper electrodes 180. The upper electrode 180a is connected with the lower electrode 120 via the second opening 171a, the upper electrode 180b is connected with the oxide semiconductor device 140 via the third opening 171b, and the upper electrode 180c is connected with the gate electrode 160 via the fourth opening 171c.

The semiconductor device 10 in embodiment 1 according to the present invention is manufactured by the manufacturing method described above. Referring to FIG. 7B, the portion of the oxide semiconductor layer 140 that is located on the first side wall 131 is a channel region 141 (FIG. 7A).

More specifically, as shown in FIG. 7A, the channel region 141 is formed to be ring-shaped in an area of the oxide semiconductor layer 140 that is covered with the gate electrode 160. Therefore, the channel region 141 of the semiconductor device 10 does not include an end of the oxide semiconductor layer 140. Since the channel region 141 has a ring shape, this structure is called the "surround type". During the etching performed to form the oxide semiconductor layer 140, the end of the oxide semiconductor layer 140 may possibly have properties thereof changed. The shape of the oxide semiconductor layer 140 as shown in FIG. 7A realizes a transistor in which the end of the oxide semiconductor layer 140 is not included in the channel region 141 of the oxide semiconductor layer 140. The transistor having such a "surround-type" structure suppresses a leak path from being formed.

Modifications of Embodiment 1

With reference to FIG. 8 through FIG. 13, modifications of embodiment 1 according to the present invention will be described. A semiconductor device 11 in modification 1 of embodiment 1 is similar to the semiconductor device 10 in embodiment 1. In the following description, the components having the identical structures or functions to those of the semiconductor device 10 will bear the identical reference signs thereto, and detailed descriptions thereof will be omitted.

Figure 8:
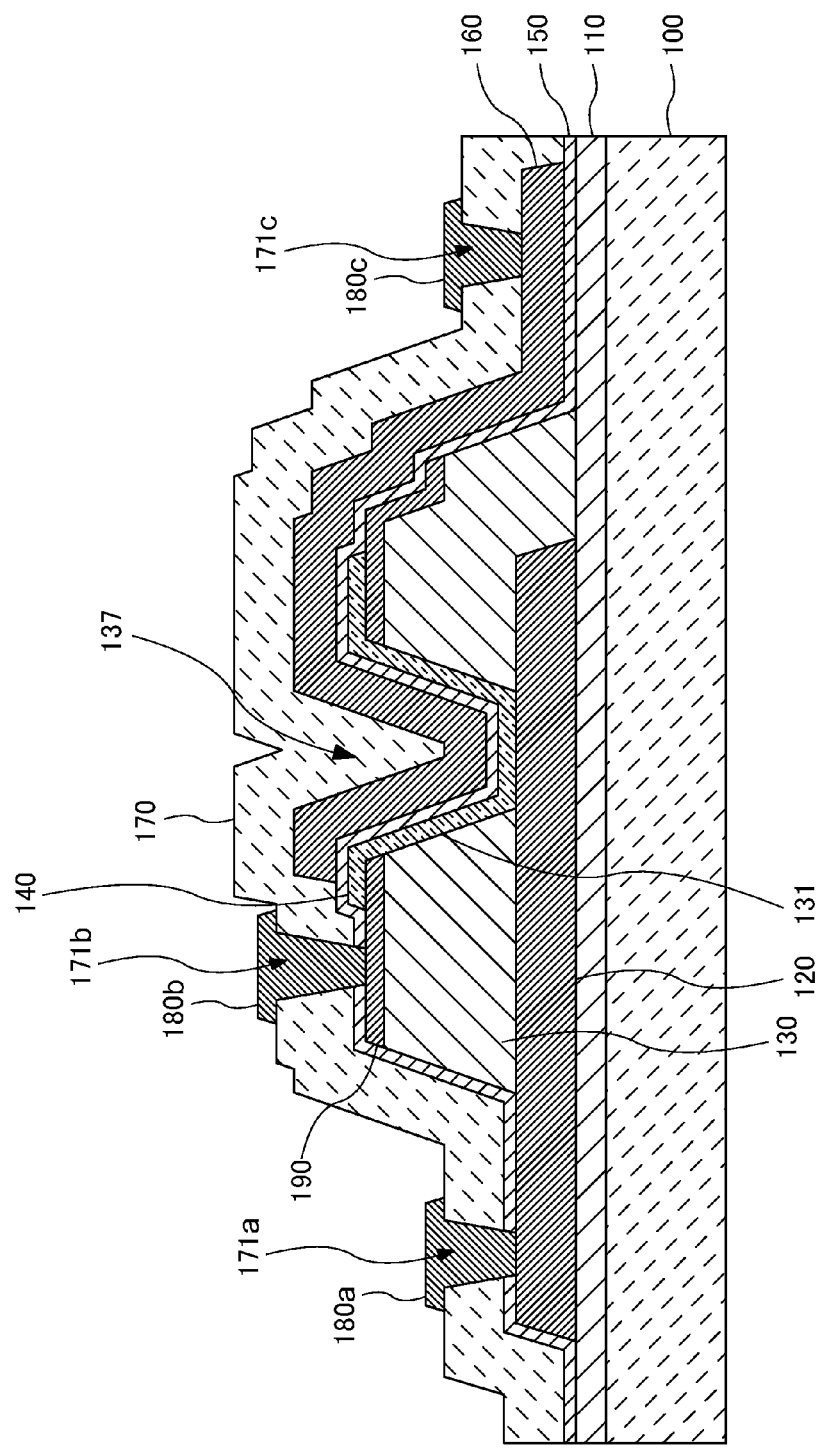
FIG. 8 is a cross-sectional view showing an overview of a semiconductor device in a modification of the embodiment according to the present invention.

FIG. 8 is a cross-sectional view showing an overview of the semiconductor device 11 in modification 1 of embodiment 1 according to the present invention. As shown in FIG. 8, in the semiconductor device 11, unlike in the semiconductor device 10 shown in FIG. 1, the upper electrode 180b is connected with the first assisting electrode 190, not with the oxide semiconductor layer 140. In other words, the upper electrode 180b is connected with the oxide semiconductor layer 140 via the first assisting electrode 190. In the semiconductor device 11, it is sufficient that the oxide semiconductor layer 140 is in contact with the first assisting electrode 190 and does not need to overlap the upper electrode 180b as seen in a plan view.

As described above, in the semiconductor device 11 in modification 1 of embodiment 1, the upper electrode 180b is in contact with the first assisting electrode 190. Therefore, the contact resistance is further decreased. As a result, the semiconductor device 11 is capable of further increasing the on-current.

Figure 9:
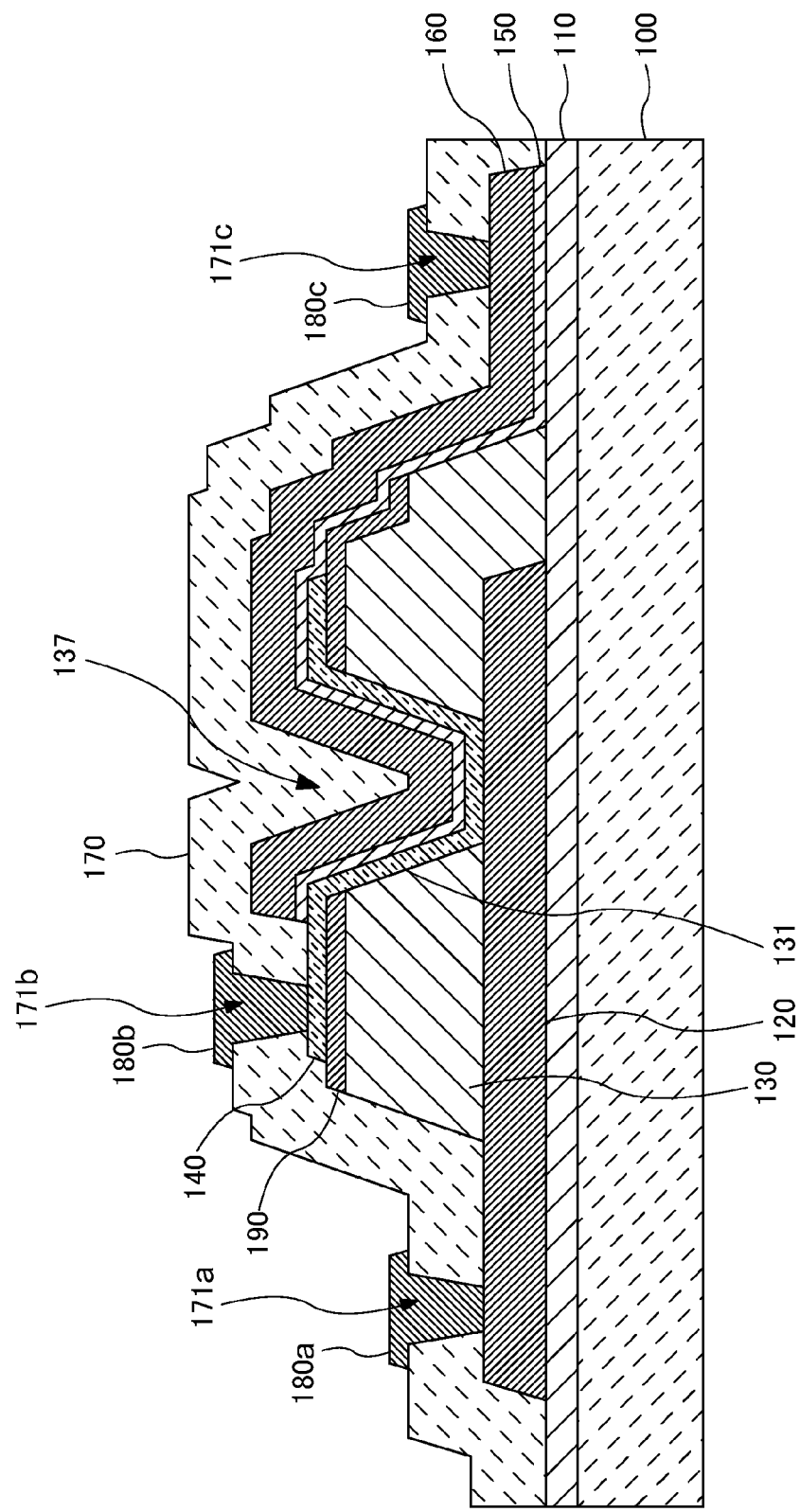
FIG. 9 is a cross-sectional view showing an overview of a semiconductor device in a modification of the embodiment according to the present invention.

FIG. 9 is a cross-sectional view showing an overview of a semiconductor device 12 in modification 2 of embodiment 1 according to the present invention. As shown in FIG. 9, in the semiconductor device 12, unlike in the semiconductor device 10 shown in FIG. 1, the gate insulating layer 150 and the gate electrode 160 have ends thereof flush. Although not shown, in the semiconductor device 12, the gate insulating layer 150 and the gate electrode 160 have substantially the same pattern as seen in a plan view. The semiconductor device 12 may be manufactured by, for example, forming the gate electrode 160 and the gate insulating layer 150 at the same time by etching in the step shown in FIG. 5B, or by performing etching to form the gate insulating layer 150 using, as a mask, the gate electrode 160 that is patterned as shown in FIG. 5B.

As described above, in the semiconductor device 12 in modification 2 of embodiment 1, portions of the second insulating layer 170 corresponding to the second opening 171a, the third opening 171b and the fourth opening 171c have the same layer structure. Therefore, in the step of forming the openings 171 in the second insulating layer 170, the condition of etching performed to form the openings 171 is adjusted easily.

Figure 10:
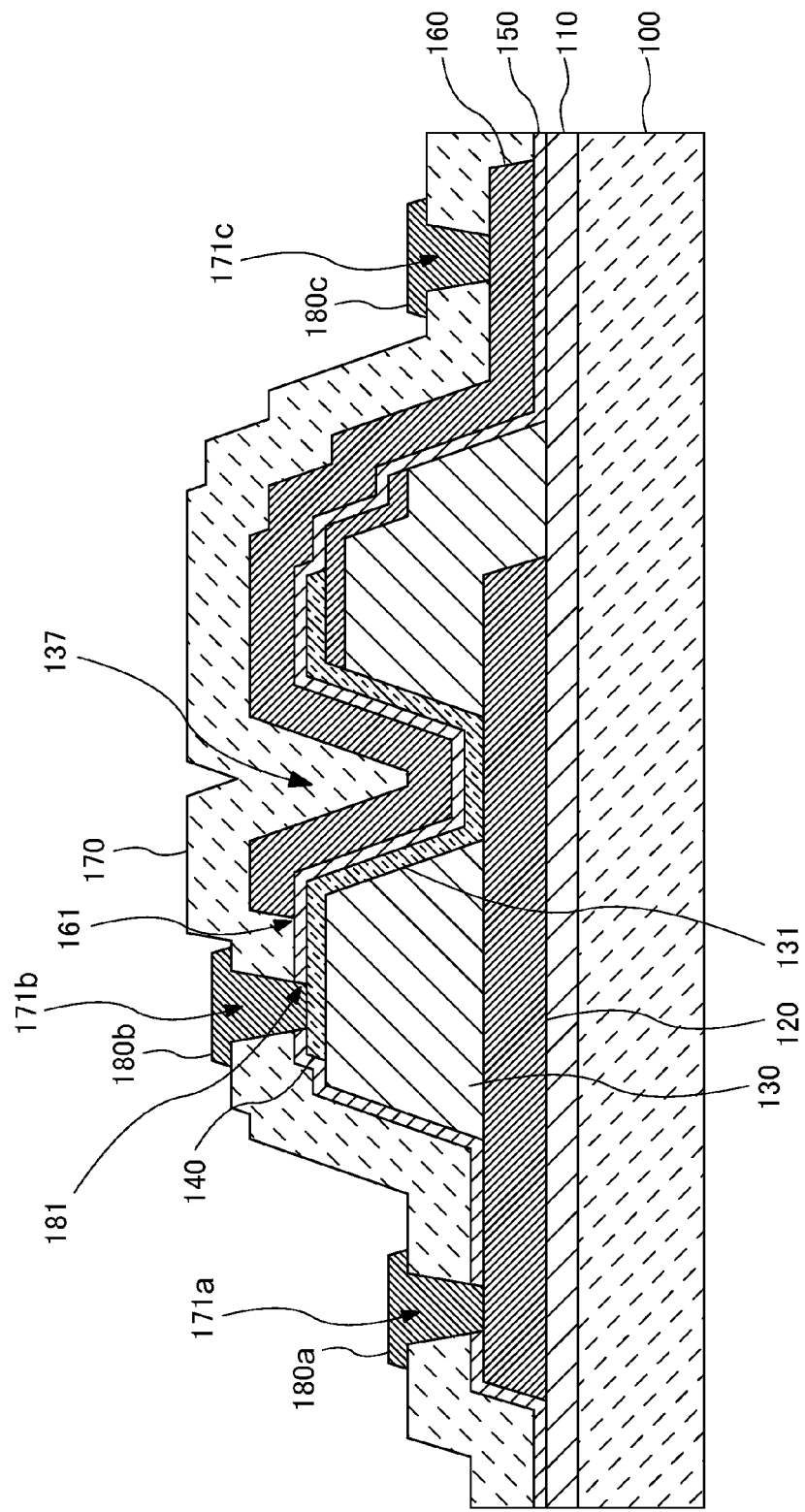
FIG. 10 is a cross-sectional view showing an overview of a semiconductor device in a modification of the embodiment according to the present invention.

FIG. 10 is a cross-sectional view showing an overview of a semiconductor device 13 in modification 3 of embodiment 1 according to the present invention. As shown in FIG. 10, in the semiconductor device 13, unlike in the semiconductor device 10 shown in FIG. 1, the oxide semiconductor layer 140 is located above the first insulating layer 130, without the first assisting electrode 190 being provided. More specifically, the upper electrode 180b is connected at a position above the first insulating layer 130, with the oxide semiconductor layer 140. In the semiconductor device 13, an offset region in which no electric field is formed by the gate voltage applied to the gate electrode 160 is present between an end 161 of the gate electrode 160 and an end 181 of the upper electrode 180b. In order to provide a higher on-current, the oxide semiconductor layer 140 having a conductivity higher than that of the channel may be provided in the offset region. The oxide semiconductor layer 140 having such a high conductivity may be formed by, for example, implanting impurities that generate carriers into the oxide semiconductor layer 140 from above using the gate electrode 160 as a mask in the step shown in FIG. 5B, or by incorporating hydrogen into the second insulating layer 170 to form an inorganic insulating film of $SiN_x$ or the like.

As described above, in the semiconductor device 13 in modification 3 of embodiment 1, the first assisting electrode 190 does not need to be formed above the first insulating layer 130. This eliminates the step of forming the film for the first assisting electrode 190 and also the step of performing the patterning to form the first assisting electrode 190. This shortens the manufacturing process. Since the first assisting electrode 190 is not located above the first insulating layer 130, the shape of the first insulating layer 130 is adjusted easily.

Figure 11:
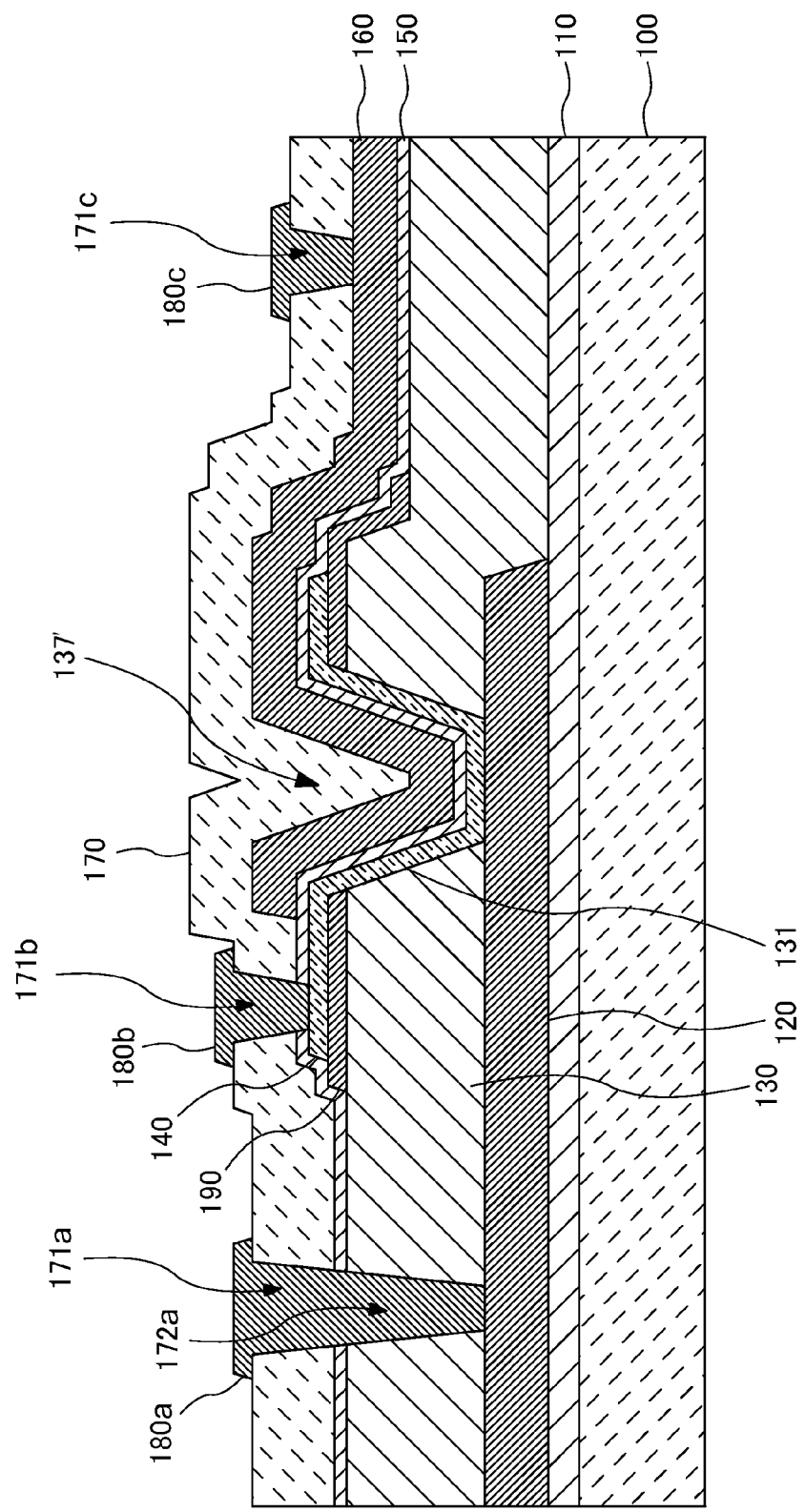
FIG. 11 is a cross-sectional view showing an overview of a semiconductor device in a modification of the embodiment according to the present invention.

FIG. 11 is a cross-sectional view showing an overview of a semiconductor device 14 in modification 4 of embodiment 1 according to the present invention. As shown in FIG. 11, in the semiconductor device 14, unlike in the semiconductor device 10 shown in FIG. 1, the first insulating layer 130 is also located below the upper electrodes 180a and 180c, and the upper electrode 180a is connected with the lower electrode 120 via an opening formed in the second insulating layer 170 and the first insulating layer 130. In other words, the upper electrode 180a is connected with the lower electrode 120 via the second opening 171a formed in the second insulating layer 170 and a fifth opening 172a formed in the first insulating layer 130.

The above-described structure of the semiconductor device 14 regarding the second opening 171a and the fifth opening 172a may be manufactured as follows, for example. In the step of forming the first insulating layer 130 by patterning shown in FIG. 3, the first opening 137 is formed. Then, in the step of forming the second insulating layer 170 and the openings 171 shown in FIG. 6, the openings are formed in the second insulating layer 170, the gate insulating layer 150 and the first insulating layer 130.

Figure 12:
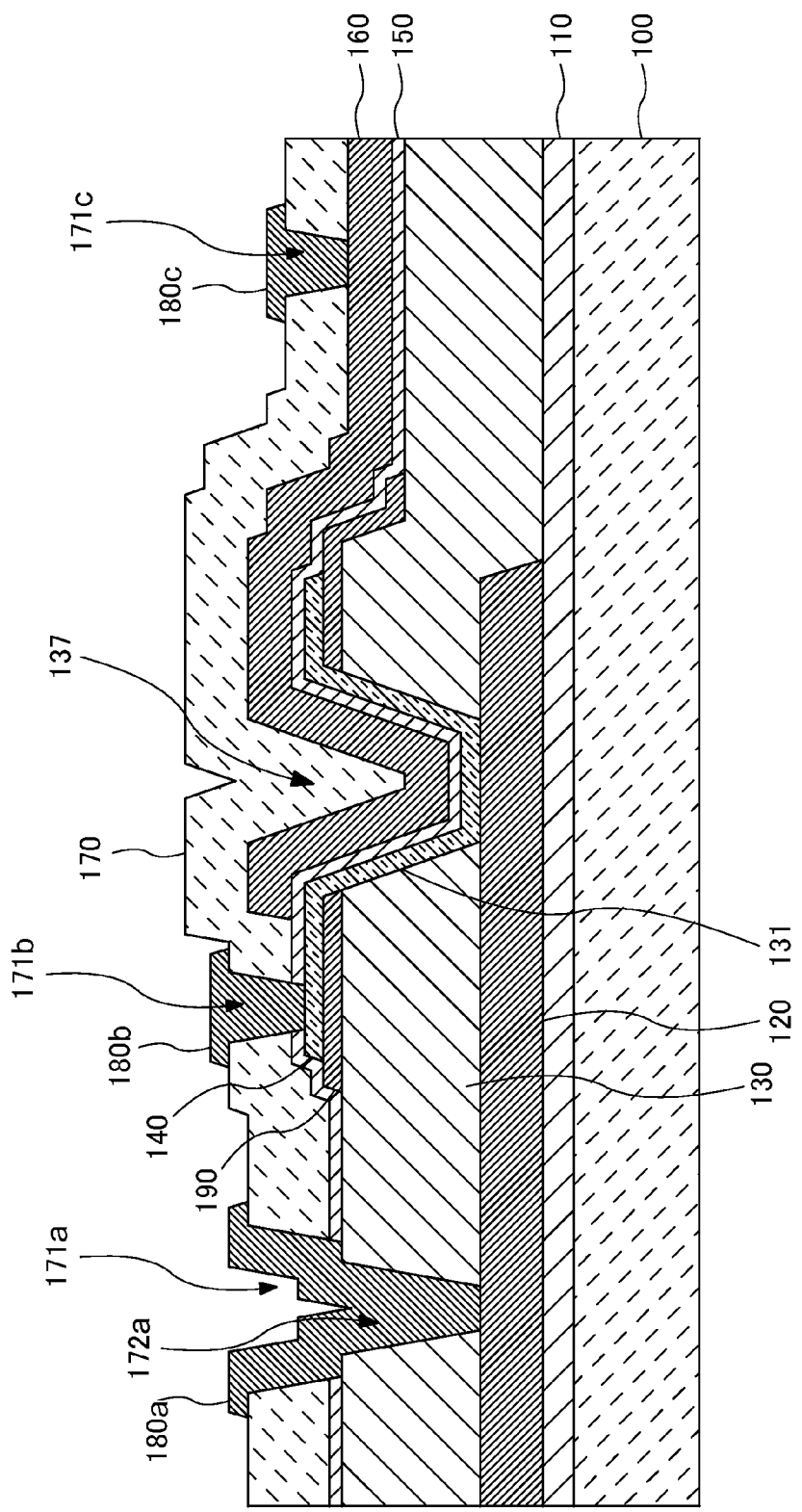
FIG. 12 is a cross-sectional view showing an overview of a semiconductor device in a modification of the embodiment according to the present invention.

FIG. 12 is a cross-sectional view showing an overview of a semiconductor device 15 in modification 5 of embodiment 1 according to the present invention. As shown in FIG. 12, the semiconductor device 15 is similar to the semiconductor device 14 shown in FIG. 11. However, in the semiconductor device 15, unlike in the semiconductor device 14 shown in FIG. 11, the bottom size of the second opening 171a and the top size of the fifth opening 172a have different planar sizes from each other.

The above-described structure of the semiconductor device 15 may be manufactured as follows, for example. In the step of forming the first insulating layer 130 by patterning shown in FIG. 3, the first opening 137 and the fifth opening 172a are formed. Then, in the step of forming the second insulating layer 170 and the openings 171 shown in FIG. 6, the second opening 171a having a planar size larger than that of the fifth opening 172a is formed in the second insulating layer 170 and the gate insulating layer 150.

Figure 13:
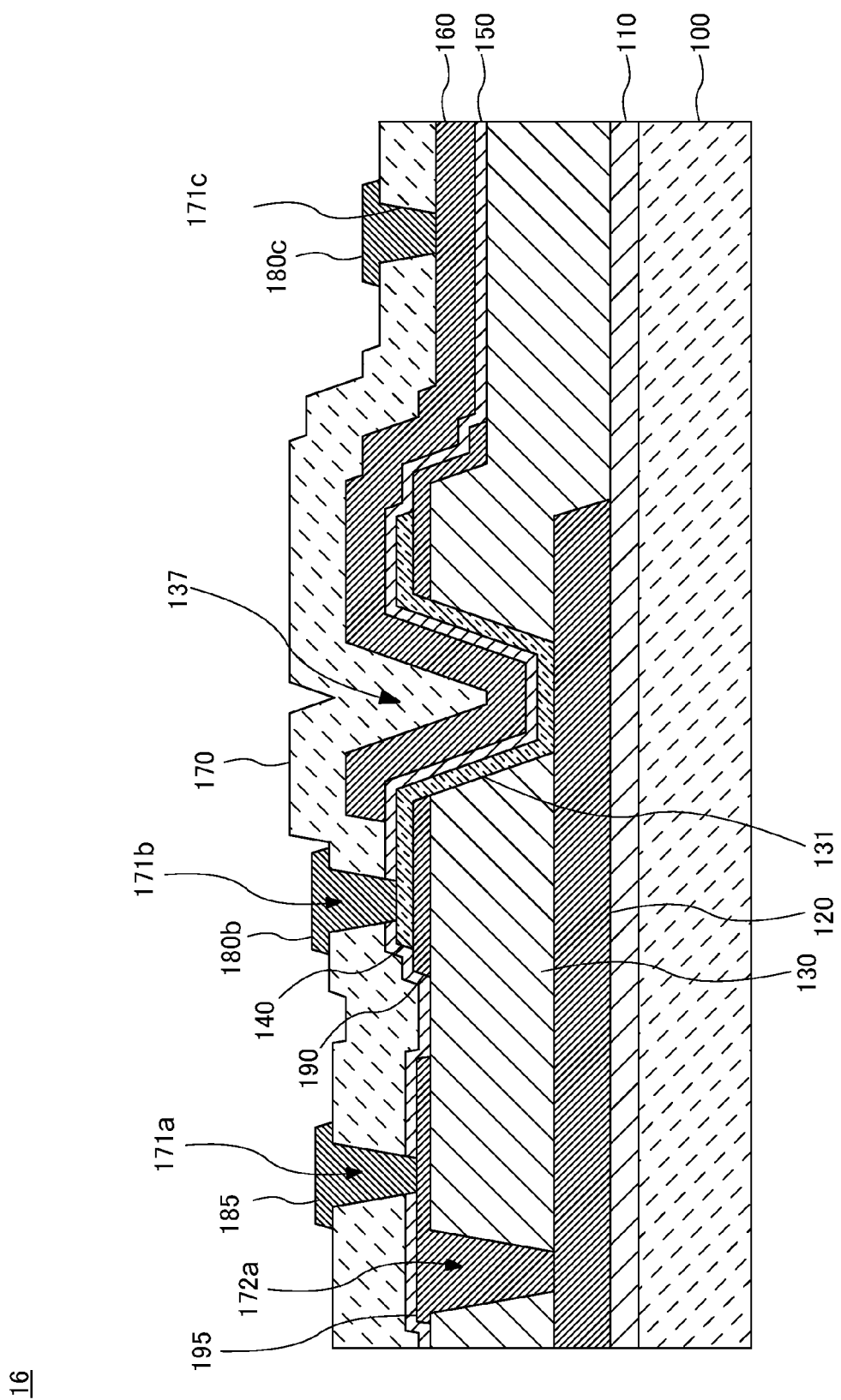
FIG. 13 is a cross-sectional view showing an overview of a semiconductor device in a modification of the embodiment according to the present invention.

FIG. 13 is a cross-sectional view showing an overview of a semiconductor device 16 in modification 6 of embodiment 1 according to the present invention. As shown in FIG. 13, the semiconductor device 16 is similar to the semiconductor device 15 shown in FIG. 12. However, in the semiconductor device 16, unlike in the semiconductor device 14 shown in FIG. 11 and the semiconductor device 15 shown in FIG. 12, the second opening 171a and the fifth opening 172a are located as being offset from each other. In the semiconductor device 16 shown in FIG. 13, an upper electrode 185 located in the second opening 171a is connected, at a position on the first insulating layer 130, with a line 195 located in, and extending from, the fifth opening 172a. The above-described structure of the semiconductor device 16 may be manufactured by substantially the same method as that of the semiconductor device 15.

As described above, in the semiconductor devices 14 through 16 in modifications 4 through 6 of embodiment 1, the first insulating layer 130 is also located below the upper electrodes 180a and 180c (in the semiconductor device 16, the upper electrodes 185 and 180c). Therefore, the number of steps formed in each semiconductor device is decreased. In addition, there is no opening reaching the underlying layer 110. Therefore, in the step of forming the openings, the underlying layer 110 is prevented from being exposed to etching, which is performed to form the openings. This eliminates the need of adjusting the etching rate ratio of the first insulating layer 130 and the second insulating layer 170 with respect to the underlying layer 110. In addition, there is no need to form an etching stopper layer on the underlying layer 110.

Embodiment 2

Figure 14A:
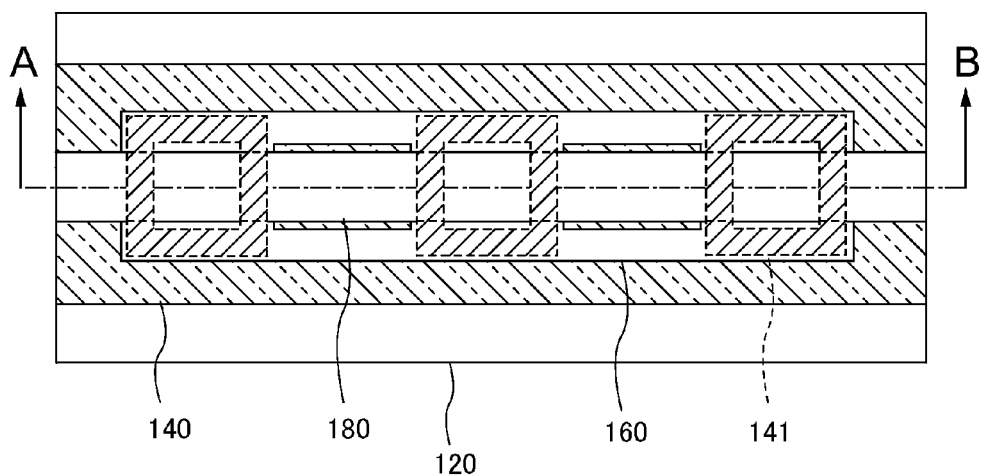
FIG. 14A is a plan view showing an overview of a semiconductor device in an embodiment according to the present invention.
Figure 14B:
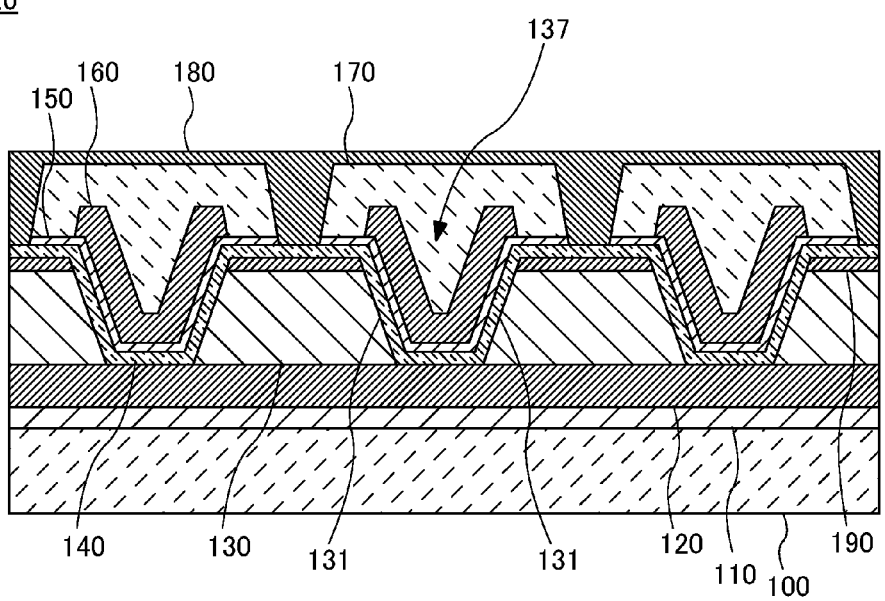
FIG. 14B is a cross-sectional view showing an overview of the semiconductor device in the embodiment according to the present invention.

With reference to FIG. 14A and FIG. 14B (FIG. 14), an overview of a semiconductor device 20 in embodiment 2 according to the present invention will be described. The semiconductor device 20 in embodiment 2 is usable in a display device or a driving circuit, like the semiconductor layer 10 in embodiment 1. The semiconductor device 20 in embodiment 2 is described as having a structure including a channel formed of an oxide semiconductor. The semiconductor device 20 in embodiment 2 is not limited to having such a structure, and may include a channel formed of, for example, a semiconductor such as silicon or the like, a compound semiconductor such as Ga—As or the like, or an organic semiconductor such as pentacene, tetracyanoquinodimethane (TCNQ) or the like. In embodiment 2, the semiconductor device 20 is a transistor. This does not limit the semiconductor device according to the present invention to a transistor.

[Structure of the Semiconductor Device 20]

FIG. 14A is a plan view showing an overview of the semiconductor device 20 in embodiment 2 according to the present invention. FIG. 14B is a cross-sectional view showing an overview of the semiconductor device 20 in embodiment 2 according to the present invention. As shown in FIG. 14, the semiconductor device 20 in embodiment 2 includes a plurality of the surround-type semiconductor devices 10 shown in FIG. 1 and FIG. 7 that are coupled parallel to each other. More specifically, the semiconductor device 20 includes a plurality of the first openings 137 located adjacent to each other, and also includes a lower electrode 120, an upper electrode 180 and a gate electrode 160 that are common to the plurality of first openings 137. Therefore, the plurality of semiconductor devices 10 are supplied with the same source-drain voltage at the same time and with the same gate voltage at the same time.

In FIG. 14, the surround-type semiconductor devices 10 shown in FIG. 1 and FIG. 7 having a structure of embodiment 1 are shown. Alternatively, a plurality of the surround-type semiconductor devices in any of the modifications of embodiment 1 shown in FIG. 8 through FIG. 13 may be used to realize a semiconductor device.

As described above, in the semiconductor device 20, the ring-shaped channel regions 141 of the plurality of semiconductor devices 10 are turned on/off at the same time. Therefore, the W length (channel width) of the semiconductor device 20 is substantially increased. As a result, the semiconductor device 20 is capable of increasing the on-current.

[Manufacturing Method of the Semiconductor Device 20]

In order to more clarify the structure of the semiconductor device 20 shown in FIG. 14, a manufacturing method of the semiconductor device 20 will be described with reference to plan views and cross-sectional views provided in FIG. 15 through FIG. 19. Each of the semiconductor devices 10 included in the semiconductor device 20 shown in FIG. 14 is the same as the semiconductor device 10 shown in FIG. 1 through FIG. 7, and thus will not be described in detail.

Figure 15A:
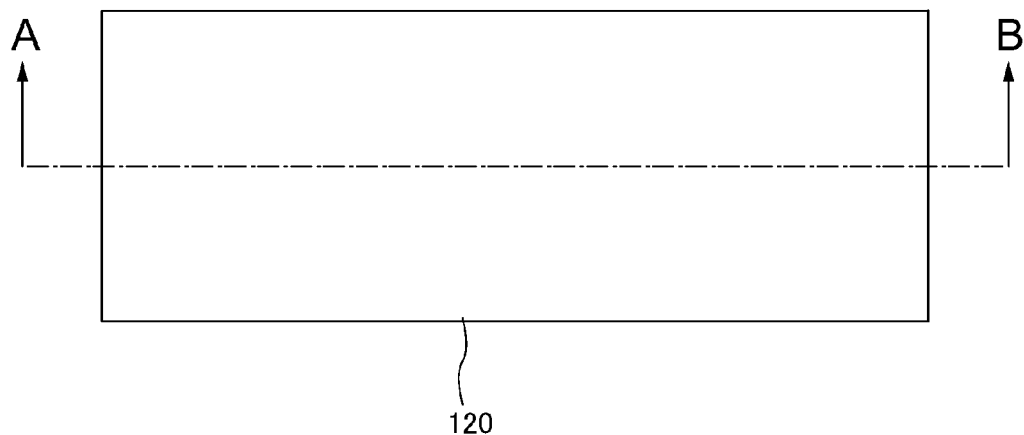
FIG. 15A is a plan view showing a step of forming a lower electrode in a manufacturing method of the semiconductor device in the embodiment according to the present invention.
Figure 15B:
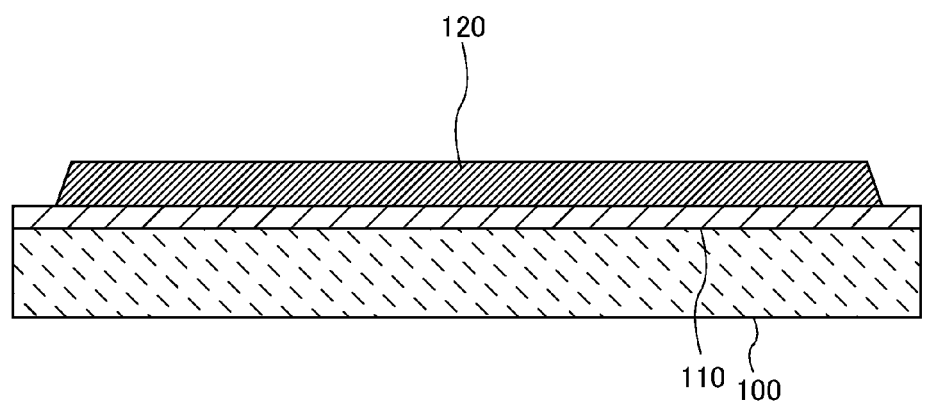
FIG. 15B is a cross-sectional view showing the step of forming the lower electrode in the manufacturing method of the semiconductor device in the embodiment according to the present invention.

FIG. 15A and FIG. 15B (FIG. 15) are respectively a plan view and a cross-sectional view showing a step of forming the lower electrode 120 in the manufacturing method of the semiconductor device 20 in embodiment 2 according to the present invention. First, referring to FIG. 15B, the underlying layer 110 and a film for the lower electrode 120 are formed on the substrate 100, and patterning is performed as shown in FIG. 15A by photolithography and etching to form the lower electrode 120.

Figure 16A:
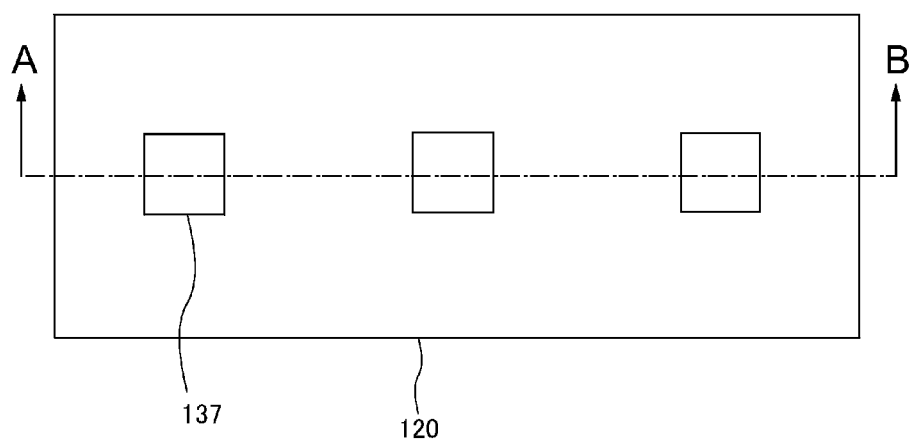
FIG. 16A is a plan view showing a step of forming a first insulating layer and a first assisting electrode on the lower electrode in the manufacturing method of the semiconductor device in the embodiment according to the present invention.
Figure 16B:
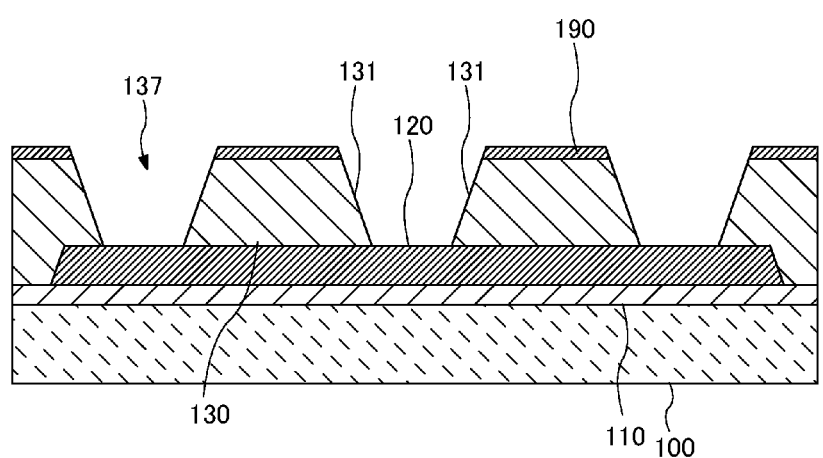
FIG. 16B is a cross-sectional view showing the step of forming the first insulating layer and the first assisting electrode on the lower electrode in the manufacturing method of the semiconductor device in the embodiment according to the present invention.

FIG. 16A and FIG. 16B (FIG. 16) are respectively a plan view and a cross-sectional view showing a step of forming the first insulating layer 130 and the first assisting electrode 190 on the lower electrode 120 in the manufacturing method of the semiconductor device 20 in embodiment 2 according to the present invention. As shown in FIG. 16, the first insulating layer 130 and the first assisting electrode 190 having the plurality of first openings 137 adjacent to each other are formed on one lower electrode 120. In the example shown in FIG. 16, three first openings 137 are formed on one lower electrode 120. The semiconductor device 20 is not limited to having such a structure, and the number of the first openings 137 formed on one lower electrode 120 may be smaller or larger than three. The first insulating layer 130 and the first assisting electrode 190 may be etched together or in separate steps. For example, after the first insulating layer 130 is formed by patterning, the film for the first assisting electrode 190 may be formed on a top surface and a side surface of the first insulating layer 130 and patterned to form the first assisting electrode 190 by photolithography and etching.

Figure 17A:
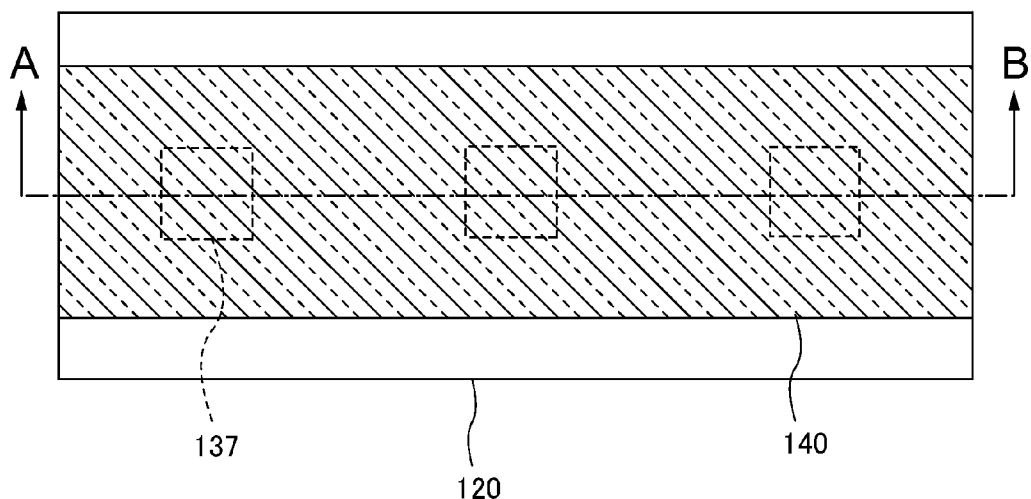
FIG. 17A is a plan view showing a step of forming an oxide semiconductor layer in the manufacturing method of the semiconductor device in the embodiment according to the present invention.
Figure 17B:
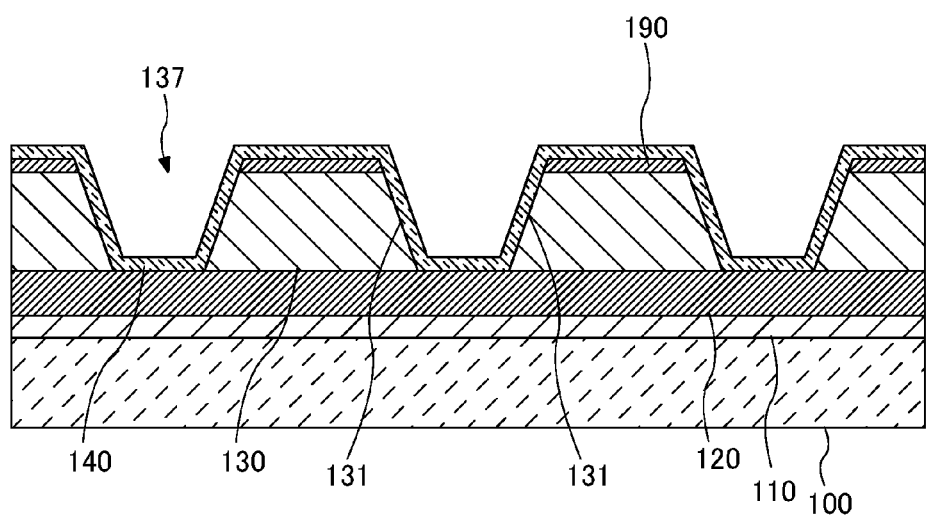
FIG. 17B is a cross-sectional view showing the step of forming the oxide semiconductor layer in the manufacturing method of the semiconductor device in the embodiment according to the present invention.

FIG. 17A and FIG. 17B (FIG. 17) are respectively a plan view and a cross-sectional view showing a step of forming the oxide semiconductor layer 140 in the manufacturing method of the semiconductor device 20 in embodiment 2 according to the present invention. Referring to FIG. 17B, a film for the oxide semiconductor layer 140 is formed on the entirety of the substrate shown in FIG. 16B, and patterning is performed as shown in FIG. 17A to form the oxide semiconductor layer 140. In the example shown in FIG. 17, the oxide semiconductor layer 140 covers the entirety of the first openings 137. It is sufficient that the oxide semiconductor layer 140 is located on the ring-shaped first side walls 131 and is at least partially connected with the lower electrode 120 and the first assisting electrode 190. Namely, the oxide semiconductor layer 140 does not need to be located to cover the top surface of the first assisting electrode 190 as shown in FIG. 17B.

Figure 18A:
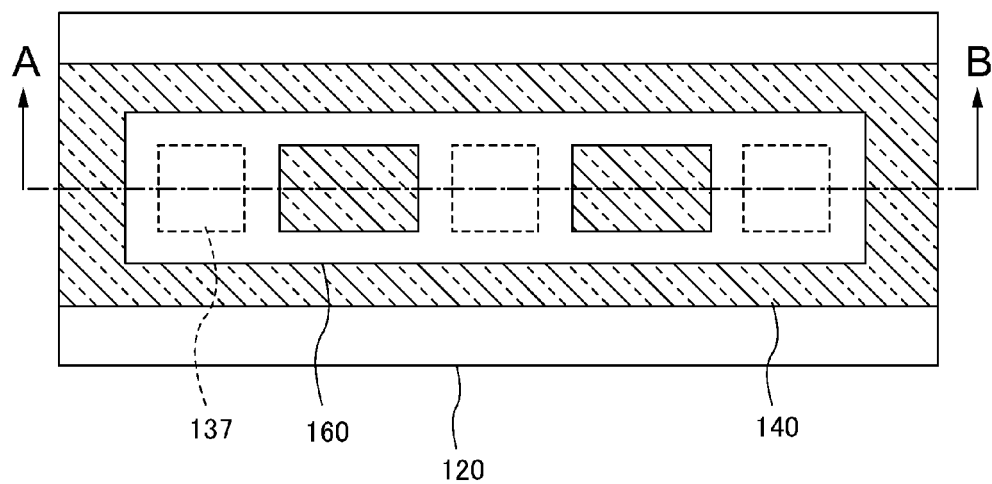
FIG. 18A is a plan view showing a step of forming a gate insulating layer and a gate electrode in the manufacturing method of the semiconductor device in the embodiment according to the present invention.
Figure 18B:
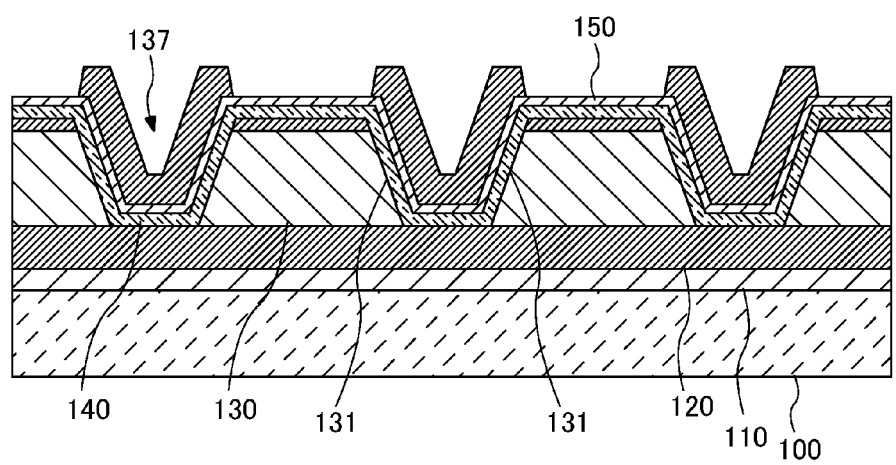
FIG. 18B is a cross-sectional view showing the step of forming the gate insulating layer and the gate electrode in the manufacturing method of the semiconductor device in the embodiment according to the present invention.

FIG. 18A and FIG. 18B (FIG. 18) are respectively a plan view and a cross-sectional view showing a step of forming the gate insulating layer 150 and the gate electrode 160 in the manufacturing method of the semiconductor device 20 in embodiment 2 according to the present invention. Referring to FIG. 18B, the gate insulating layer 150 and a film for the gate electrode 160 are formed on the entirety of the substrate shown in FIG. 17B, and patterning is performed as shown in FIG. 18A to form the gate electrode 160.

Figure 19A:
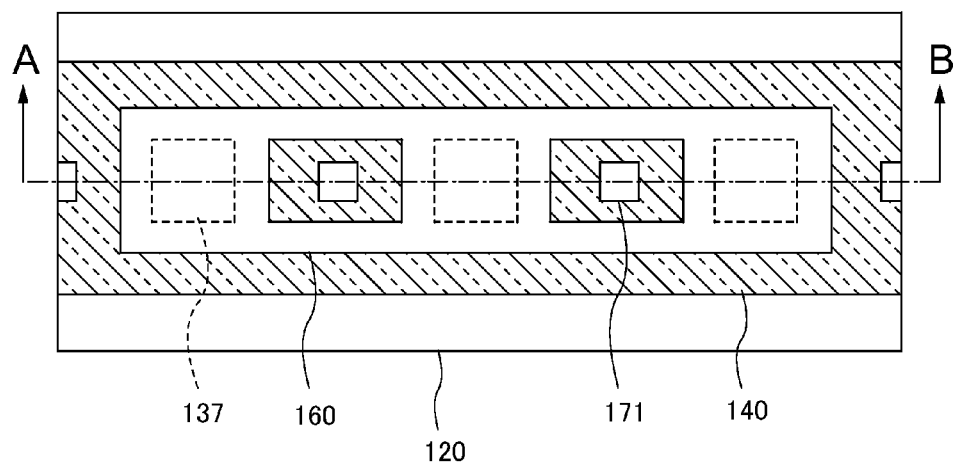
FIG. 19A is a plan view showing a step of forming a second insulating layer and also forming openings in the second insulating layer and the gate insulating layer in the manufacturing method of the semiconductor device in the embodiment according to the present invention.
Figure 19B:
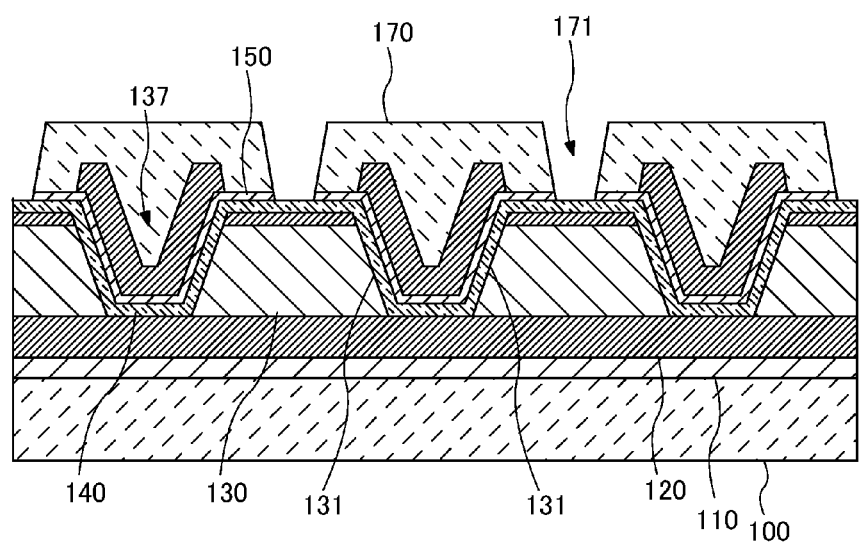
FIG. 19B is a cross-sectional view showing the step of forming the second insulating layer and also forming the openings in the second insulating layer and the gate insulating layer in the manufacturing method of the semiconductor device in the embodiment according to the present invention.

FIG. 19A and FIG. 19B (FIG. 19) are respectively a plan view and a cross-sectional view showing a step of forming the second insulating layer 170 and also forming the plurality of openings 171 in the second insulating layer 170 and the gate insulating layer 150 in the manufacturing method of the semiconductor device 20 in embodiment 2 according to the present invention. Referring to FIG. 19B, the second insulating layer 170 is formed on the entirety of the substrate shown in FIG. 18B, and patterning is performed as shown in FIG. 19A to form the plurality of openings 171. The openings 171 each expose a portion of the oxide semiconductor layer 140 that is located on the first insulating layer 130. Then, a film for the upper electrode 180 is formed on the entirety of the substrate shown in FIG. 19B, and patterning is performed to form the upper electrode 180 as shown in FIG. 14. In this manner, the semiconductor device 20 shown in FIG. 14 is manufactured.

Embodiment 3

Figure 20A:
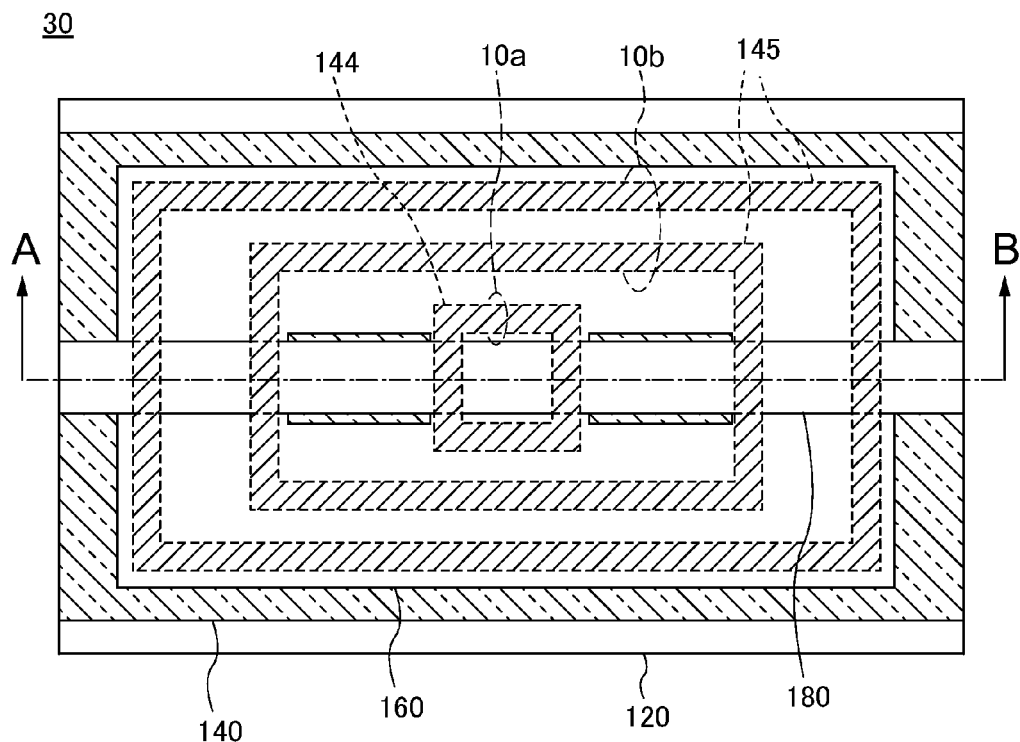
FIG. 20A is a plan view showing an overview of a semiconductor device in an embodiment according to the present invention.
Figure 20B:
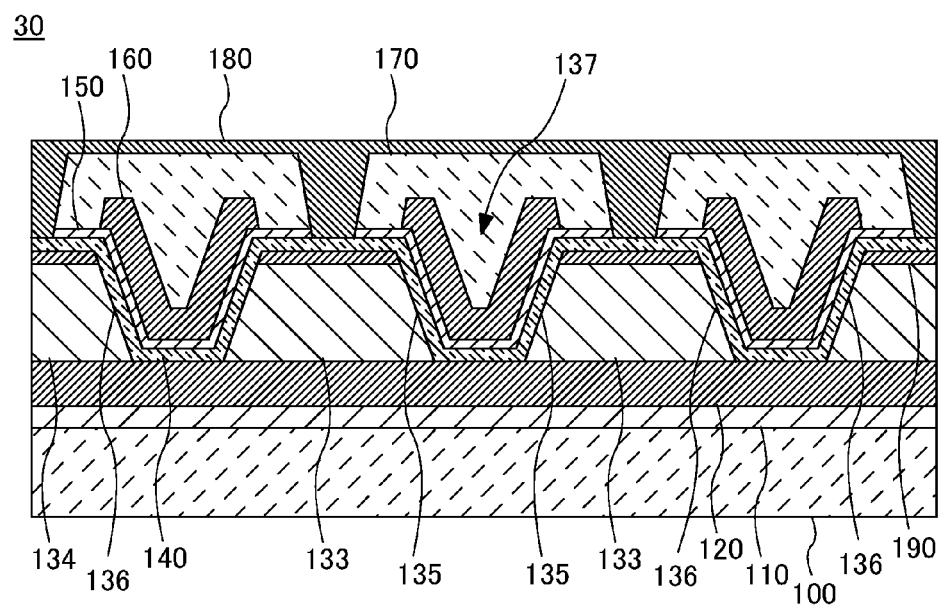
FIG. 20B is a cross-sectional view showing an overview of the semiconductor device in the embodiment according to the present invention.

With reference to FIG. 20A and FIG. 20B (FIG. 20), an overview of a semiconductor device 30 in embodiment 3 according to the present invention will be described. The semiconductor device 30 in embodiment 3 is usable in a display device or a driving circuit, like the semiconductor layer 10 in embodiment 1. The semiconductor device 30 in embodiment 3 is described as having a structure including a channel formed of an oxide semiconductor. The semiconductor device 30 in embodiment 3 is not limited to having such a structure, and may include a channel formed of, for example, a semiconductor such as silicon or the like, a compound semiconductor such as Ga—As or the like, or an organic semiconductor such as pentacene, tetracyanoquinodimethane (TCNQ) or the like. In embodiment 3, the semiconductor device 30 is a transistor. This does not limit the semiconductor device according to the present invention to a transistor.

[Structure of the Semiconductor Device 30]

FIG. 20A is a plan view showing an overview of the semiconductor device 30 in embodiment 3 according to the present invention. FIG. 20B is a cross-sectional view showing an overview of the semiconductor device 30 in embodiment 3 according to the present invention. As shown in FIG. 20, the semiconductor device 30 in embodiment 3 includes a plurality of the surround-type semiconductor devices 10 shown in FIG. 1 and FIG. 7 that are coupled parallel to each other, such that the ring-shaped channel regions are multiplexed. More specifically, a semiconductor device 10*b* including second ring-shaped channel regions 145, which are outer channel regions, is located to surround a semiconductor device 10*a* including a first ring-shaped channel region 144, which is an inner channel region.

Figure 21A:
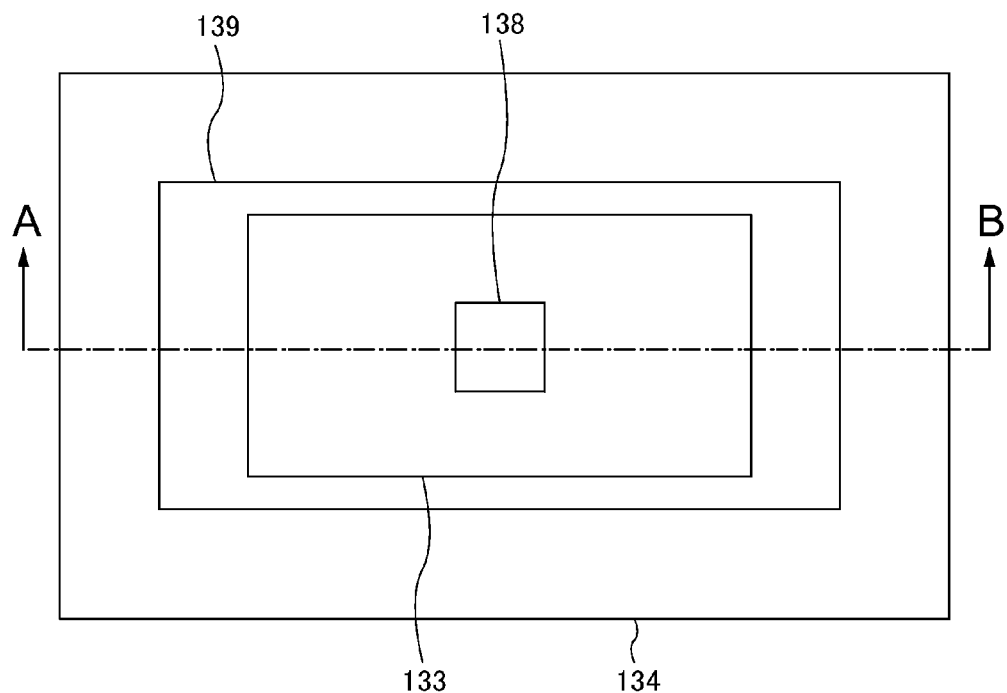
FIG. 21A is a plan view showing a step of forming a first insulating layer, a second insulating layer, a first assisting electrode and a second assisting electrode on a lower electrode in a manufacturing method of the semiconductor device in the embodiment according to the present invention.
Figure 21B:
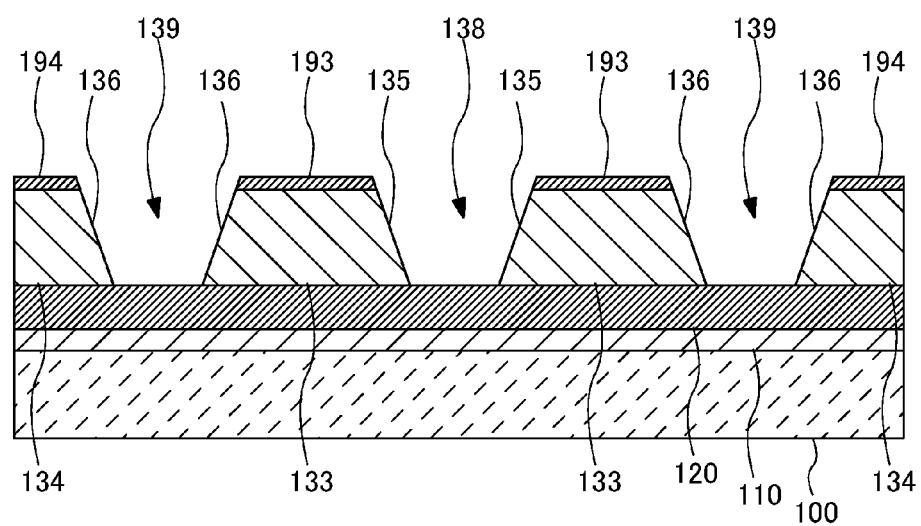
FIG. 21B is a cross-sectional view showing the step of forming the first insulating layer, the second insulating layer, the first assisting electrode and the second assisting electrode on the lower electrode in the manufacturing method of the semiconductor device in the embodiment according to the present invention.

As shown also in FIG. 21A and FIG. 21B (FIG. 21), the semiconductor device 30 includes a first insulating layer 133 having a first side wall 135 exposed to a first opening 138, which is an inner opening, and also having a part of a second side wall 136 exposed to a first opening 139, which is an outer opening. The semiconductor device 30 also includes a third insulating layer 134 located to surround the first insulating layer 133 and having a part of the second side wall 136 exposed to the first opening 139. More specifically, the first side wall 135 is provided at an inner circumferential surface of the first insulating layer 133, and the second side wall 136 is provided at an outer circumferential surface of the first insulating layer 133 and at an inner circumferential surface of the third insulating layer 134. In other words, the second side wall 136 is located to surround the first side wall 135. The first electrodes 120 of the semiconductor devices 10*a* and 10*b* are provided as one integral first electrode 120, the gate electrodes 160 of the semiconductor devices 10*a* and 10*b* are provided as one integral gate electrode 160, and the upper electrodes 180 of the semiconductor devices 10*a* and 10*b* are provided as one integral upper electrode 180. More specifically, one integrated gate electrode 160 is provided on the first side surface 135 and the second side surface 136. Therefore, the semiconductor devices 10*a* and 10*b* in the semiconductor devices 30 are supplied with the same source-drain voltage at the same time and with the same gate voltage at the same time.

In the example shown in FIG. 20, the surround-type semiconductor devices 10*a* and 10*b* each have the structure of embodiment 1 shown in FIG. 1 and FIG. 7. Alternatively, a plurality of the surround-type semiconductor devices in any of the modifications of embodiment 1 shown in FIG. 8 through FIG. 13 may be used to realize a semiconductor device.

As described above, in the semiconductor device 30, the ring-shaped channel region 144 of the semiconductor device 10*a* and the ring-shaped channel regions 145 of the semiconductor device 10*b* are turned on/off at the same time. Therefore, the W length of the semiconductor device 30 is substantially increased. As a result, the semiconductor device 30 is capable of increasing the on-current.

[Manufacturing Method of the Semiconductor Device 30]

In order to more clarify the structure of the semiconductor device 30 shown in FIG. 20, a manufacturing method of the semiconductor device 30 will be described with reference to plan views and cross-sectional views provided in FIG. 21 through FIG. 24. The cross-sectional structure of each of the semiconductor devices 10*a* and 10*b* included in the semiconductor device 30 shown in FIG. 20 is the same as that of the semiconductor device 10 shown in FIG. 1 and FIG. 7, and thus will not be described in detail.

FIG. 21A and FIG. 21B (FIG. 21) are respectively a plan view and a cross-sectional view showing a step of forming the first insulating layer 133, the third insulating layer 134, a first assisting electrode 193 and a second assisting electrode 194 on the lower electrode 120 in the manufacturing method of the semiconductor device 30 in embodiment 3 according to the present invention. As shown in FIG. 21, the first insulating layer 133 and the first assisting electrode 193, which are ring-shaped, and also the third insulating layer 134 and the second assisting electrode 194, which are also ring-shaped, are formed on one lower electrode 120. The third insulating layer 134 and the second assisting electrode 194 are located around the first insulating layer 133 and the first assisting electrode 193. In the semiconductor device 30, a channel is formed on the first side wall 135 and the second side wall 136.

Figure 22A:
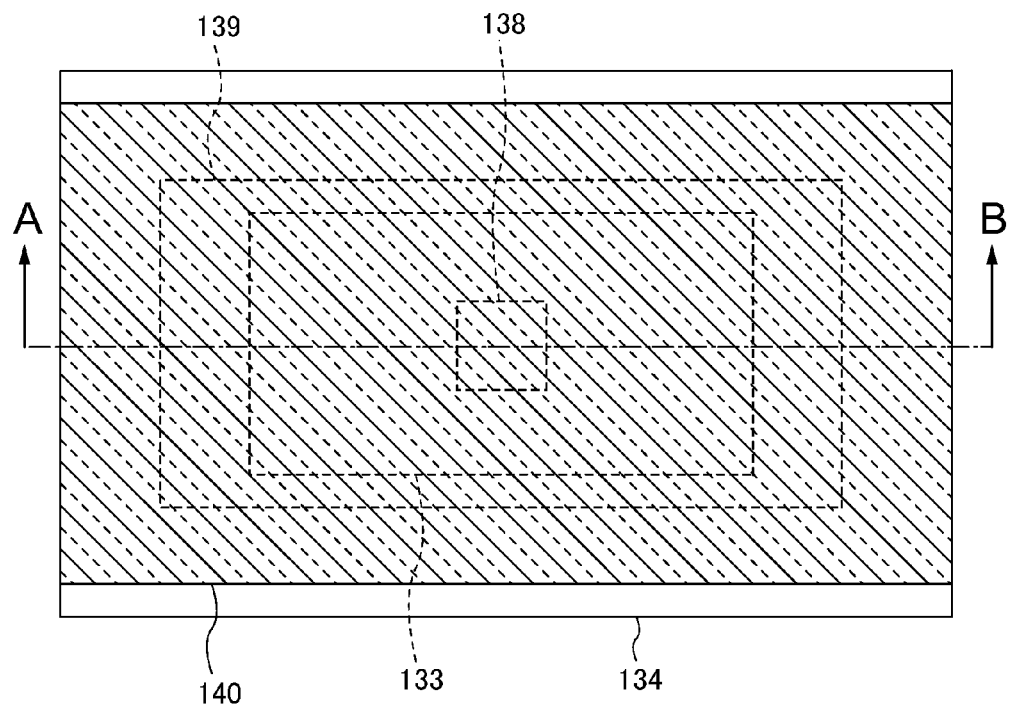
FIG. 22A is a plan view showing a step of forming an oxide semiconductor layer in the manufacturing method of the semiconductor device in the embodiment according to the present invention.
Figure 22B:
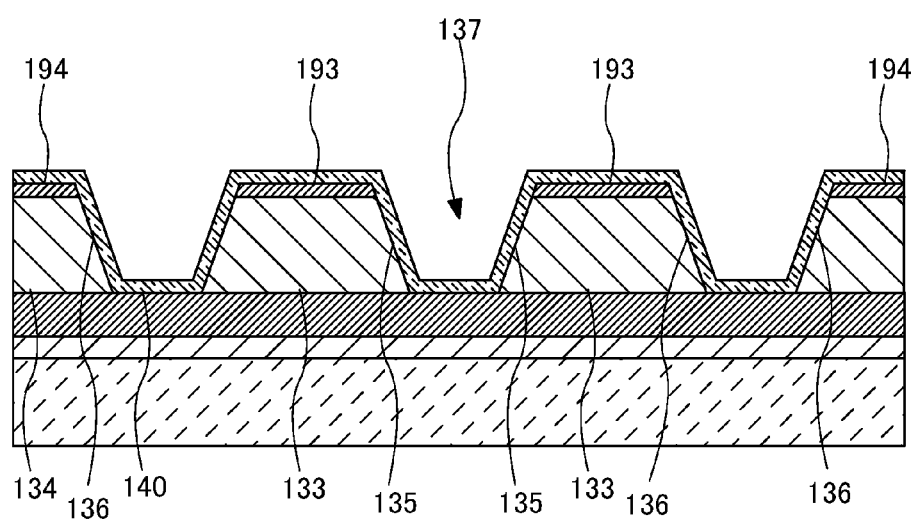
FIG. 22B is a cross-sectional view showing the step of forming the oxide semiconductor layer in the manufacturing method of the semiconductor device in the embodiment according to the present invention.

FIG. 22A and FIG. 22B (FIG. 22) are respectively a plan view and a cross-sectional view showing a step of forming the oxide semiconductor layer 140 in the manufacturing method of the semiconductor device 30 in embodiment 3 according to the present invention. Referring to FIG. 22B, a film for the oxide semiconductor layer 140 is formed on the entirety of the substrate shown in FIG. 21B, and patterning is performed as shown in FIG. 22A to form the oxide semiconductor layer 140. In the example shown in FIG. 22, the oxide semiconductor layer 140 covers the first insulating layer 133, and has an outer perimeter that is located outer to an inner perimeter of the third insulating layer 134. It is sufficient that the oxide semiconductor layer 140 is located at least on the ring-shaped first side wall 135 and the ring-shaped second side wall 136 and is at least partially connected with the lower electrode 120, the first assisting electrode 193 and the second assisting electrode 194.

Figure 23A:
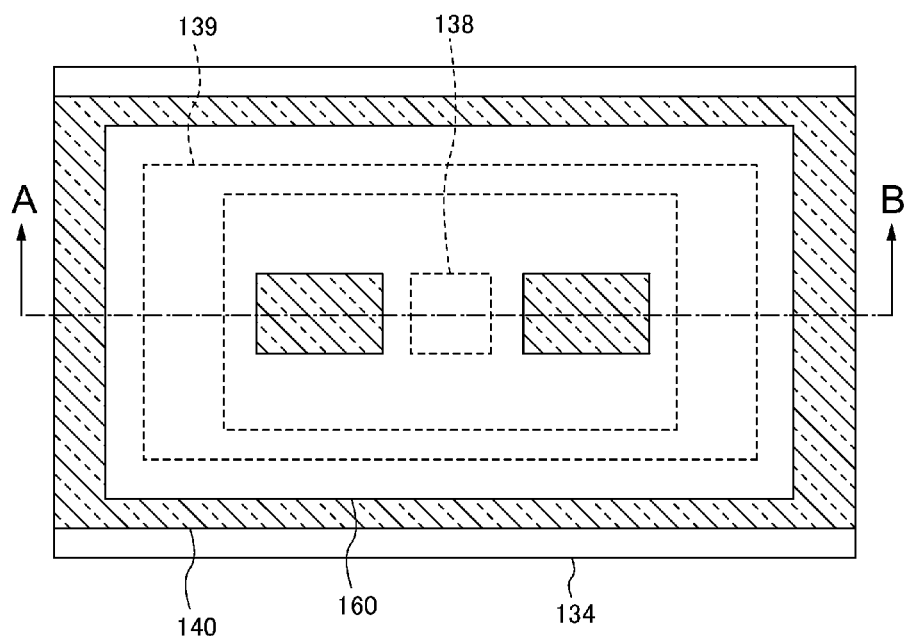
FIG. 23A is a plan view showing a step of forming a gate insulating layer and a gate electrode in the manufacturing method of the semiconductor device in the embodiment according to the present invention.
Figure 23B:
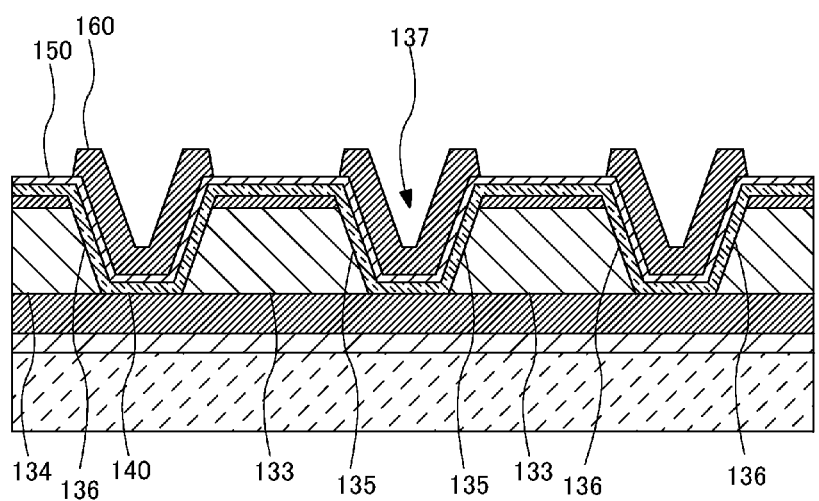
FIG. 23B is a cross-sectional view showing the step of forming the gate insulating layer and the gate electrode in the manufacturing method of the semiconductor device in the embodiment according to the present invention.

FIG. 23A and FIG. 23B (FIG. 23) are respectively a plan view and a cross-sectional view showing a step of forming the gate insulating layer 150 and the gate electrode 160 in the manufacturing method of the semiconductor device 30 in embodiment 3 according to the present invention. Referring to FIG. 23B, the gate insulating layer 150 and a film for the gate electrode 160 are formed on the entirety of the substrate shown in FIG. 22B, and patterning is performed as shown in FIG. 23A to form the gate electrode 160.

Figure 24A:
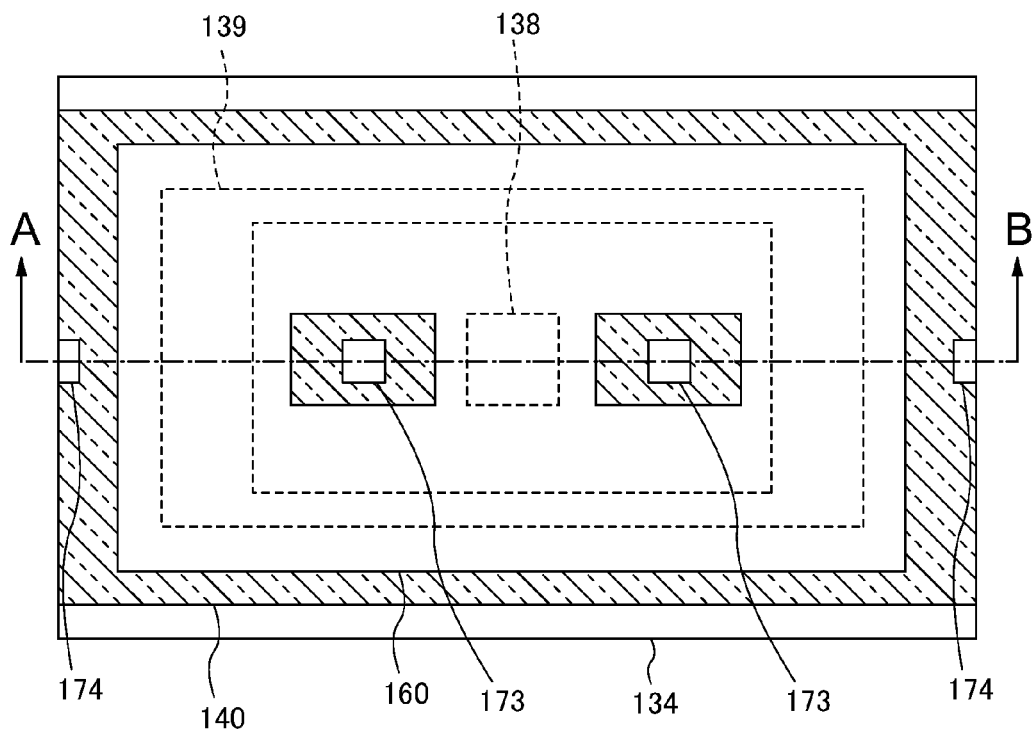
FIG. 24A is a plan view showing a step of forming a second insulating layer and also forming openings in the second insulating layer and the gate insulating layer in the manufacturing method of the semiconductor device in the embodiment according to the present invention.
Figure 24B:
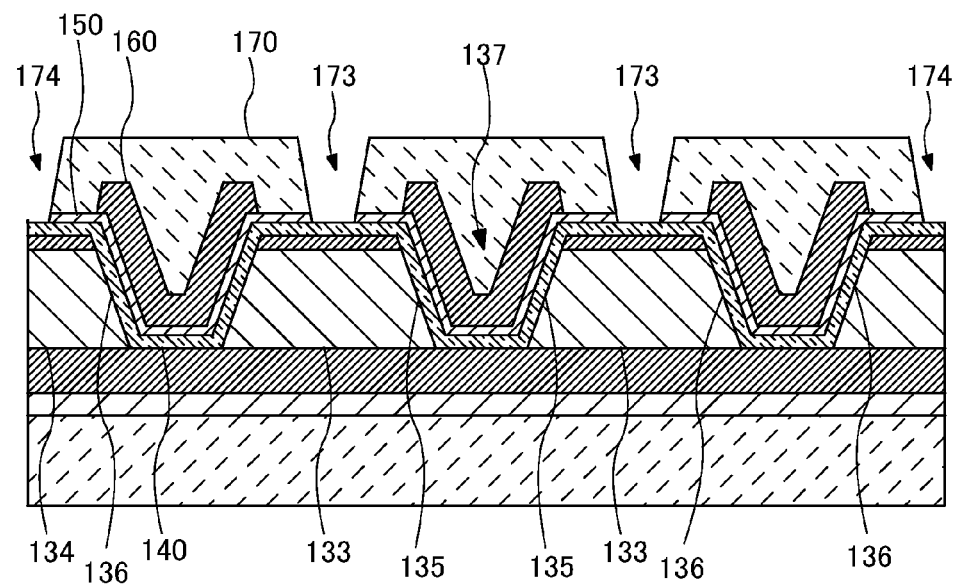
FIG. 24B is a cross-sectional view showing the step of forming the second insulating layer and also forming the openings in the second insulating layer and the gate insulating layer in the manufacturing method of the semiconductor device in the embodiment according to the present invention.

FIG. 24A and FIG. 24B (FIG. 24) are respectively a plan view and a cross-sectional view showing a step of forming the second insulating layer 170 and also forming openings 173 and 174 in the second insulating layer 170 and the gate insulating layer 150 in the manufacturing method of the semiconductor device 30 in embodiment 3 according to the present invention. Referring to FIG. 24B, the second insulating layer 170 is formed on the entirety of the substrate shown in FIG. 23B, and patterning is performed as shown in FIG. 24A to form the openings 173 and 174. The openings 173 each expose a portion of the oxide semiconductor layer 140 that is located on the first insulating layer 133, and the openings 174 each expose a portion of the oxide semiconductor layer 140 that is located on the third insulating layer 134. Then, a film for the upper electrode 180 is formed on the entirety of the substrate shown in FIG. 24B, and patterning is performed to form the upper electrode 180 as shown in FIG. 20. In this manner, the semiconductor device 30 shown in FIG. 20 is manufactured.

The present invention is not limited to any of the above-described embodiments, and the embodiments may be modified appropriately without departing from the gist of the present invention.

What is claimed is:

1. A semiconductor device, comprising:
   a first electrode;
   a first insulating layer having a first opening reaching the first electrode and having a ring-shaped first side wall exposed to the first opening;
   an oxide semiconductor layer on the first side wall, the oxide semiconductor layer being connected with the first electrode;
   a gate insulating layer on the oxide semiconductor layer, the oxide semiconductor layer being between the first side wall and the gate insulating layer;

a gate electrode facing the oxide semiconductor layer on the first side wall, the gate insulating layer being between the oxide semiconductor layer and the gate electrode; and a second electrode above the first insulating layer, the second electrode being connected with the oxide semiconductor layer;

further comprising: a second insulating layer above the first electrode, the first insulating layer, the oxide semiconductor layer and the gate insulating layer;

a fourth electrode connected with the first electrode; and a fifth electrode connected with the gate electrode;

wherein: the fourth electrode is connected with the first electrode via a second opening in the second insulating layer;

the second electrode is connected with the oxide semiconductor layer via a third opening in the second insulating layer; and the fifth electrode is connected with the gate electrode via a fourth opening in the second insulating layer.

2. The semiconductor device according to claim 1, wherein the first side wall is tapered.

3. The semiconductor device according to claim 1, wherein the oxide semiconductor layer covers the first side wall.

4. The semiconductor device according to claim 1, further comprising a third electrode between the first insulating layer and the oxide semiconductor layer above the first insulating layer.

5. The semiconductor device according to claim 4, wherein the second electrode is connected with the oxide semiconductor layer on a side opposite to the third electrode.

6. The semiconductor device according to claim 4, wherein the second electrode is connected with the oxide semiconductor layer via the third electrode.

7. The semiconductor device according to claim 1, wherein the fourth electrode is connected with the first electrode via the second opening and a fifth opening in the first insulating layer.

8. The semiconductor device according to claim 1, wherein:
a plurality of the first openings are located adjacent to each other; and
the first electrode, the second electrode and the gate electrode are common to the plurality of first openings.

9. The semiconductor device according to claim 1, further comprising a ring-shaped third insulating layer surrounding the first insulating layer;
wherein:
the first insulating layer and the third insulating layer have a second side wall located to surround the first side wall; and
the gate electrode is located to face the first side wall and the second side wall.

10. A semiconductor device, comprising:
a first insulating layer having a ring-shaped first side wall;
an oxide semiconductor layer on the first side wall;
a gate insulating layer on the oxide semiconductor layer, the oxide semiconductor layer being between the first side wall and the gate insulating layer;
a gate electrode facing the oxide semiconductor layer on the first side wall, the gate insulating layer being between the oxide semiconductor layer and the gate electrode;

a first electrode below the first insulating layer, the first electrode being connected with a first portion of the oxide semiconductor layer; and a second electrode above the first insulating layer, the second electrode being connected with a second portion of the oxide semiconductor layer;

further comprising: a second insulating layer above the gate electrode;

a fourth electrode connected with the first electrode; and a fifth electrode connected with the gate electrode;

wherein: the fourth electrode is connected with the first electrode via a second opening in the second insulating layer;

the second electrode is connected with the oxide semiconductor layer via a third opening in the second insulating layer; and the fifth electrode is connected with the gate electrode via a fourth opening in the second insulating layer.

11. The semiconductor device according to claim 10, wherein the first side wall is tapered.

12. The semiconductor device according to claim 10, wherein the oxide semiconductor layer covers the first side wall.

13. The semiconductor device according to claim 10, further comprising a third electrode between the first insulating layer and the oxide semiconductor layer above the first insulating layer.

14. The semiconductor device according to claim 13, wherein the second electrode is connected with the oxide semiconductor layer on a side opposite to the third electrode.

15. The semiconductor device according to claim 13, wherein the second electrode is connected with the oxide semiconductor layer via the third electrode.

16. The semiconductor device according to claim 10, wherein the fourth electrode is connected with the first electrode via the second opening and a fifth opening in the first insulating layer.

17. The semiconductor device according to claim 10, wherein:
a plurality of the first side walls are located adjacent to each other; and
the first electrode, the second electrode and the gate electrode are common to the plurality of first side walls.

18. The semiconductor device according to claim 10, further comprising a ring-shaped third insulating layer surrounding the first insulating layer;
wherein:
the first insulating layer and the third insulating layer have a second side wall located to surround the first side wall; and
the gate electrode is located to face the first side wall and the second side wall.

* * * * *